United States Patent
Johnson

(10) Patent No.: US 11,373,691 B2
(45) Date of Patent: Jun. 28, 2022

(54) CLOCK LOCKING FOR PACKET BASED COMMUNICATIONS OF MEMORY DEVICES

(71) Applicant: Micron Technology, Inc., Boise, ID (US)

(72) Inventor: James Brian Johnson, Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 16/951,705

(22) Filed: Nov. 18, 2020

(65) Prior Publication Data
US 2021/0193198 A1    Jun. 24, 2021

Related U.S. Application Data

(60) Provisional application No. 62/951,811, filed on Dec. 20, 2019.

(51) Int. Cl.
*G11C 7/10*      (2006.01)
*G06F 1/10*      (2006.01)
*G06F 1/12*      (2006.01)

(52) U.S. Cl.
CPC .............. *G11C 7/1072* (2013.01); *G06F 1/10* (2013.01); *G06F 1/12* (2013.01); *G11C 7/1006* (2013.01)

(58) Field of Classification Search
CPC ... G11C 7/1072; G11C 7/1006; G11C 29/023; G11C 29/50012; G11C 2007/2254; G11C 7/1066; G11C 7/222; G11C 29/028; G11C 7/1093; G06F 1/10; G06F 1/12
See application file for complete search history.

(56) References Cited

U.S. PATENT DOCUMENTS

| | | | |
|---|---|---|---|
| 2002/0041650 A1* | 4/2002 | Richmond | H04J 3/07 375/372 |
| 2004/0008732 A1 | 1/2004 | Skierszkan et al. | |
| 2004/0186879 A1 | 9/2004 | Ha et al. | |
| 2008/0225603 A1* | 9/2008 | Hein | G11C 7/1051 365/189.05 |

(Continued)

OTHER PUBLICATIONS

ISA/KR, International Search Report and Written Opinion of the International Searching Authority, Int'l Appl. No. PCT/US2020/064249, Mar. 26, 2021, Korean Intellectual Property Office, Seo-gu, Daejeon, Republic of Korea, 11 pgs.

*Primary Examiner* — Ajay Ojha

(74) *Attorney, Agent, or Firm* — Holland & Hart LLP

(57) ABSTRACT

Methods, systems, and devices for clock locking for frame-based communications of memory devices are described. A memory system may include a memory device and a host device. The memory device may receive one or more frames of data from the host device, the one or more frames of data communicated by the host device using a first frame clock. The memory device may generate a second frame clock aligned with the one or more frames on receiving the one or more frames and align one or more operations of the memory device with the second frame clock. In some examples, the host device may receive a second set of frames from the memory device based on transmitting the first set of frames. The host device may align one or more operations of the host device with the second set of frames received from the memory device.

35 Claims, 15 Drawing Sheets

(56) References Cited

U.S. PATENT DOCUMENTS

| | | | |
|---|---|---|---|
| 2013/0083611 A1* | 4/2013 | Ware | G06F 3/0673 |
| | | | 365/191 |
| 2014/0281326 A1* | 9/2014 | Van Huben | G11C 5/04 |
| | | | 711/167 |
| 2016/0359612 A1* | 12/2016 | Shi | H03L 7/0807 |
| 2017/0200482 A1 | 7/2017 | Fox et al. | |
| 2018/0062692 A1 | 3/2018 | Huh et al. | |
| 2019/0121775 A1 | 4/2019 | Johnson et al. | |

\* cited by examiner

CLOCK LOCKING FOR PACKET BASED COMMUNICATIONS OF MEMORY DEVICES

CROSS REFERENCE

The present Applications for Patent claims priority to U.S. Provisional Patent Application No. 62/951,811 by Johnson, entitled "CLOCK LOCKING FOR PACKET BASED COMMUNICATIONS OF MEMORY DEVICES," filed Dec. 20, 2019, which is assigned to the assignee hereof and is expressly incorporated by reference in its entirety.

BACKGROUND

The following relates generally to one or more memory systems and more specifically to clock locking for frame-based communications of memory devices.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
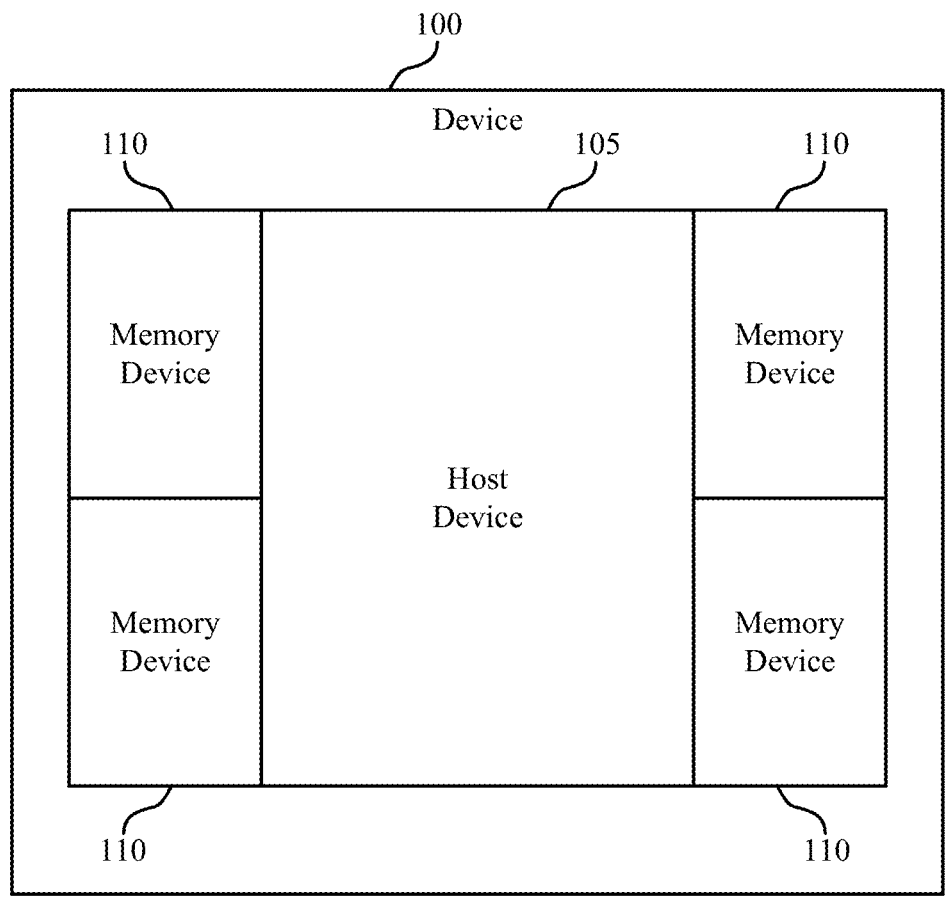
FIG. 1 illustrates an example of a device that supports clock locking for frame-based communications of memory devices in accordance with examples as disclosed herein.

A memory controller and a memory device may be configured to communicate large amounts of data relatively quickly. In some examples, to facilitate such high data rates, every symbol of a frame may be used to communicate data or control information and not be used in communicating overhead signaling, such as headers (e.g., headers may be overhead that may reduce the overall rate of data transfer between the memory controller and the memory device). In some cases, however, some techniques for communicating without overhead signaling may be deficient. For example, the memory controller may transmit data and/or commands to the memory device over multiple data channels in order to facilitate the relatively high data rates. As the quantity (e.g., a numerical quantity or number) of channels increases, there may be a relatively higher chance of errors and/or delays associated with the communications between the memory controller and the memory device. Further, some circuits configured to identify frame boundaries (e.g., without the use of headers in the frame) may utilize a relatively large amount of power and space in a memory system.

Techniques are described herein for a clock locking communications protocol between the host device and the memory device. Specifically, the described techniques enable a memory system to implement a frame synchronization procedure to identify the beginning, the end, or other segments of a frame based on a frame clock (e.g., without the use of headers or other information within the frame). Such techniques may also mitigate the impact of latency and errors in the memory system. For example, a memory controller may generate one or more frames of data to transmit to a memory device. The one or more frames of data may be aligned to a frame clock generated by a component at the memory controller (e.g., a reference frame clock). The memory device may receive the one or more frames of data and align the frames of data to a second frame clock generated at the memory device. For example, the memory device may perform a frame synchronization procedure based on the second frame clock in order to accurately receive and decode the frames of data with a reduced chance of communication errors (e.g., due to accounting for latency of memory operations). The memory controller may also receive data from the memory device (e.g., one or more frames of data including read data, among other examples of data). In some examples, the memory controller may include components configured to generate a third frame clock to perform a frame synchronization procedure. In some other examples, the memory controller may include different components to receive and decode the data from the memory device, such as a delay-locked loop circuit. Additionally or alternatively, the techniques described herein may provide for the memory device to transmit a first clock pattern during a first time period (e.g., a full rate clock pattern to ensure more reliable communications during an active time period of the system) and a second clock pattern during a second time period (e.g., a frame clock pattern to provide enhanced power savings during an idle time period of the system).

Features of the disclosure are initially described in the context of memory devices and dies as described with reference to FIGS. 1-2. Features of the disclosure are further described in the context of structures, block diagrams, timing diagrams, and flowcharts that relate to clock locking for frame-based communications of memory devices as described with reference to FIGS. 3-13.

FIG. 1 illustrates an example of a device 100 that supports clock locking for packet based communications of memory devices in accordance with examples as disclosed herein. The device 100 may include a host device 105 and a plurality of memory devices 110. The plurality of memory device 110 may be examples a finer grain memory device (e.g., finer grain dynamic read access memory (DRAM) or finer grain FeRAM).

The host device 105 may be an example of a processor (e.g., a central processing unit (CPU), a graphics processing unit (GPU)) or a system on a chip (SoC). In some cases, the host device 105 may be separate component from the memory device such that the host device 105 may be manufactured separately from the memory device. In some cases, the host device 105 may be external to the memory device 110 (e.g., a laptop, server, personal computing device, smartphone, personal computer). In the device 100, the memory devices 110 may be configured to store data for the host device 105. The host device 105 may exchange information with the memory devices 110 using signals communicated over signal paths. In some cases, the signal paths at least partially include an interposer (e.g., a silicon interposer or an organic substrate).

In some situations, the device 100 may perform better using a high-speed connection between the host device 105 and the memory devices 110. As such, some memory devices 110 support applications, processes, host devices, or processors that have multiple terabytes per second (TB/s) bandwidth needs. Satisfying such a bandwidth constraint within an acceptable energy budget poses challenges.

The memory devices 110 may be configured such that the signal path between the memory cells in the memory devices 110 and the host device 105 are as short as possible. For example, the memory devices 110 may be bufferless memory devices. In another example, the data channels coupling a memory device 110 with the host device 105 may be configured to be shorter than previous designs.

In some cases, an interposer may be used to couple the memory devices 110 with the host device 105. Depending on the constraints of the host device 105 (e.g., bandwidth constraints), various different types of interposers may be used (e.g., silicon interposers or organic interposers). The memory dies of the memory devices 110 may be configured to work with multiple types of interposers. As such, the memory dies of the memory devices 110 may be reconfigurable based on a type of the interposer used to couple the host device 105 with the memory devices 110.

In some examples, the memory devices 110 and/or the host device 105 may implement a clock locking communications protocol as described herein. For example, a memory controller (e.g., a memory controller of the host device 105 or a memory device 110) may generate a first frame clock (e.g., a reference frame clock) and one or more frames of data aligned to the first frame clock. Components of a memory device 110 may receive the one or more frames of data from the memory controller (e.g., via data channels between the memory controller and the memory device 110) and align the frames of data to a second frame clock generated at the memory device 110. For example, the memory device 110 may perform a frame synchronization procedure based on the second frame clock in order to accurately receive and decode the frames of data with a reduced chance of communication errors. The memory controller may also receive data from the memory device 110. In some examples, the memory controller may include components configured to generate a third frame clock for performing an associated frame synchronization procedure. In some other examples, the memory controller may include different components to receive and decode the data from the memory device 110, such as a delay-locked loop circuit. Additionally or alternatively, the techniques described herein may provide for the memory device 110 and/or the memory controller to transmit a first clock pattern during a first time period (e.g., a full rate clock pattern to ensure more reliable communications during an active time period) and a second clock pattern during a second time period (e.g., a frame clock pattern to provide enhanced power savings during an idle time period).

Figure 2:
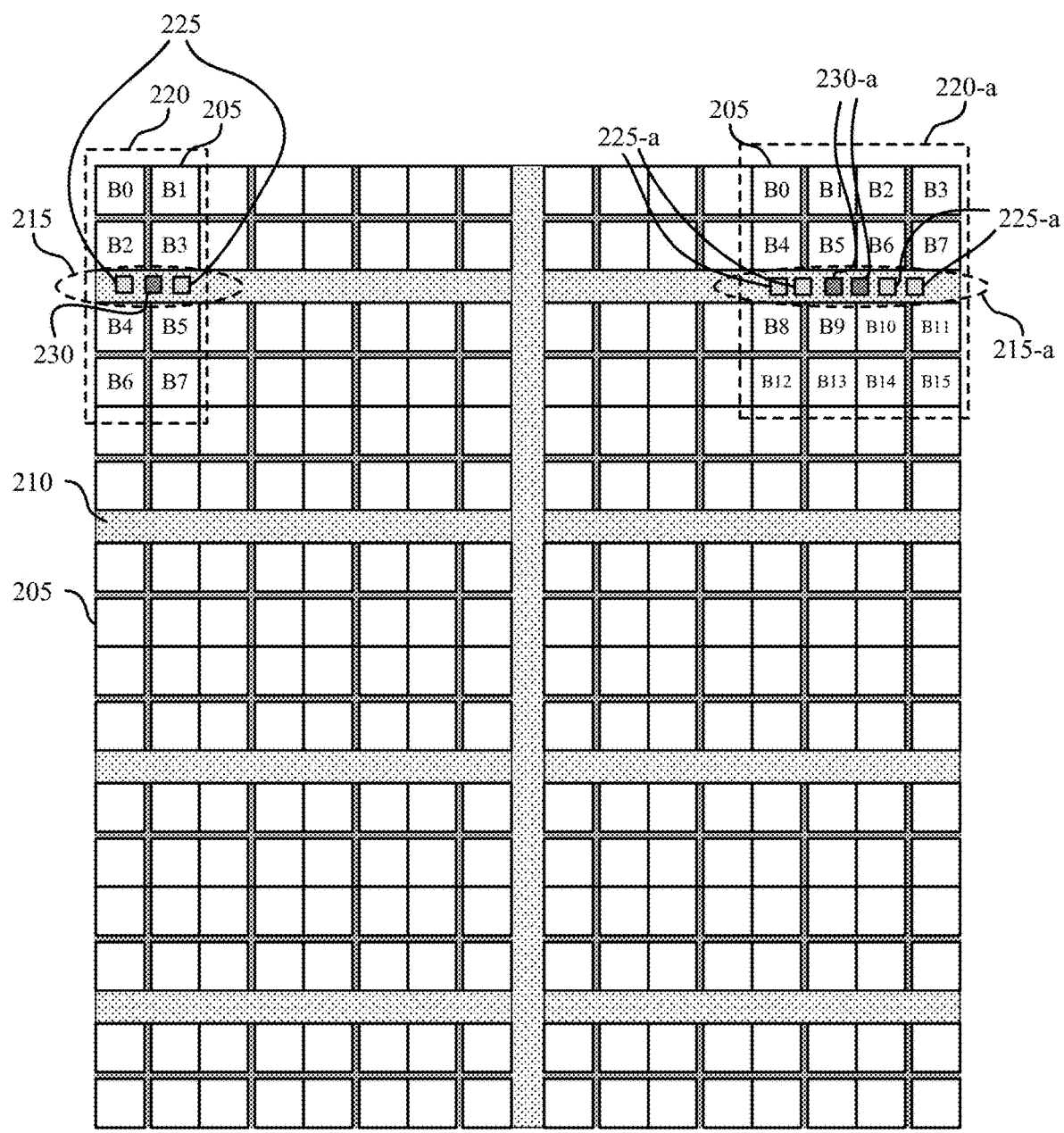
FIG. 2 illustrates an example of a memory die that supports clock locking for frame-based communications of memory devices in accordance with examples as disclosed herein.

FIG. 2 illustrates an example of a memory die 200 that supports clock locking for packet based communications of memory devices in accordance with examples as disclosed herein. In some cases, the memory die 200 may be referred to as a memory array, an array of memory cells, or a deck of memory cells. The various components of the memory die 200 may be configured to facilitate high bandwidth data transfer between the host device and a memory device with which the memory die 200 is associated.

The memory die 200 may include a plurality of banks 205 of memory cells (as represented by the white boxes), a plurality of input/output (I/O) areas 210 (sometimes referred to as I/O regions or I/O stripes) traversing the memory cells of the memory die 200, and a plurality of data channels 215 that couple the memory die 200 with the host device. Each of the banks 205 of memory cells include a plurality of memory cells configured to store data. The memory cells may be DRAM memory cells, FeRAM memory cells, or other types of memory cells described herein. The plurality of I/O areas 210 may include a plurality of power pins and ground pins configured to couple the memory cells of the memory die 200 with power and ground.

The memory die 200 may be divided into cell regions 220 associated with different data channels 215. For example, a single data channel 215 may be configured to couple a single cell region 220 to the host device. The pins of the I/O area may be configured to couple multiple cell regions 220 of the memory die 200 to power, ground, virtual ground, and/or other supporting components.

To provide a high throughput of data (e.g., multiple TB/s) between a host device (not shown) and the memory die 200, a path length between any given memory cell and the host interface may be shortened, as compared to previous solutions. In addition, shortening the data path between any given memory cell and the host device may also reduce the power consumed during an access operation (e.g., read operation or write operation) of that given memory cell. Different architectures and/or strategies may be employed to reduce the size of the data path.

In some examples, the memory die 200 may be partitioned into a plurality of cell regions 220. Each cell region 220 may be associated with a data channel 215. Two different types of cell region 220 are illustrated, but the entire memory die 200 may be populated with any quantity of cell regions 220 having any shape. A cell region 220 may include a plurality of banks 205 of memory cells. There may be any quantity of banks 205 in a cell region 220. For example, the memory die 200 illustrates a first cell region 220 that includes eight banks 205 and a second cell region 220-a that includes sixteen banks 205-a. Other quantities of banks in the cell region are possible, however (e.g., two, three, four, five, six, seven, eight, nine, ten, eleven, twelve, thirteen, fourteen, fifteen, sixteen, seventeen, eighteen, nineteen, twenty, twenty-one, twenty-two, twenty-three, twenty-four, twenty-five, twenty-six, twenty-seven, twenty-eight, twenty-nine, thirty, thirty-one, thirty-two, etc.). The size of the cell region 220 may be selected based on the bandwidth constraints of the host device, the power constraints of the host device or the memory device, the size of the data channel, the type of interposer used to couple the memory die 200 with the host device, a data rate associated with the data channel, other considerations, or combinations thereof. In some cases, the memory die 200 may be partitioned such that each cell region 220 is the same size. In other cases, the memory die 200 may be partitioned such that the memory die 200 has cell regions 220 of different sizes.

A data channel 215 (associated with a cell region) may include pins for coupling the memory cells of the cell region 220 with the host device. At least a portion of the data channel 215 may comprise channels of the interposer. The data channel 215 may include a data width specifying how many data pins 225 (sometimes referenced as DQ pins) are in the data channel 215. The quantity of pins in the data channel 215 may be based on the quantity of layers in the memory device because a single data channel 215 may be configured to couple with multiple layers. For example, a data channel may have a channel width of two data pins (e.g., X2 channel), four data pins (e.g., X4 channel), eight data pins (e.g., X8 channel), sixteen data pins (e.g., X16 channel), etc. The data channel may also include at least one command/address (C/A) pin 230. Each memory cell in the cell region 220 may be configured to transfer data to and from the host device using the pins 225, 230 associated with the cell region 220. The data channel 215 may also include a clock pin (e.g., CLK) and/or a register clock pin (e.g., RLCK). In some cases, the data channel 215 may include an error correcting code (ECC) pin (not shown) for facilitating error detection and correction procedures.

In some cases, the I/O area 210 may bisect the banks 205 of memory cells in the cell region 220. In this manner, the data path for any individual memory cell may be shortened. The C/A pin 230 may be configured to communicate command frames between the memory die 200 and the host device.

In some examples, a memory system including the memory die 200 may implement a clock locking communications protocol as described herein. For example, a memory controller (e.g., a memory controller of a host device 105 or a memory device 110) may generate a first frame clock (e.g., a reference frame clock) and one or more frames of data aligned to the first frame clock, such as a read command data transmitted to the memory die 200 via a data channel 215. Components of a memory device 110 (e.g., including the memory die 200) may receive the one or more frames of data from the memory controller and align the frames of data to a second frame clock generated at the memory device 110. For example, the memory device 110 may perform a frame synchronization procedure based on the second frame clock in order to accurately receive and decode the frames of data with a reduced chance of communication errors, for example, due to accounting for a latency associated with receiving a read command and transmitting associated read data back to the controller. As an example, the memory controller may also receive data (e.g., the read data) from the memory device 110. In some examples, the memory controller may include components configured to generate a third frame clock for performing an associated frame synchronization procedure. In some other examples, the memory controller may include different components to receive and decode the data from the memory device 110, such as a delay-locked loop circuit. Additionally or alternatively, the techniques described herein may provide for the memory device 110 and/or the memory controller to transmit a first clock pattern during a first time period (e.g., a full rate clock pattern to ensure more reliable communications during an active time period) and a second clock pattern during a second time period (e.g., a frame clock pattern to provide enhanced power savings during an idle time period).

Figure 3:
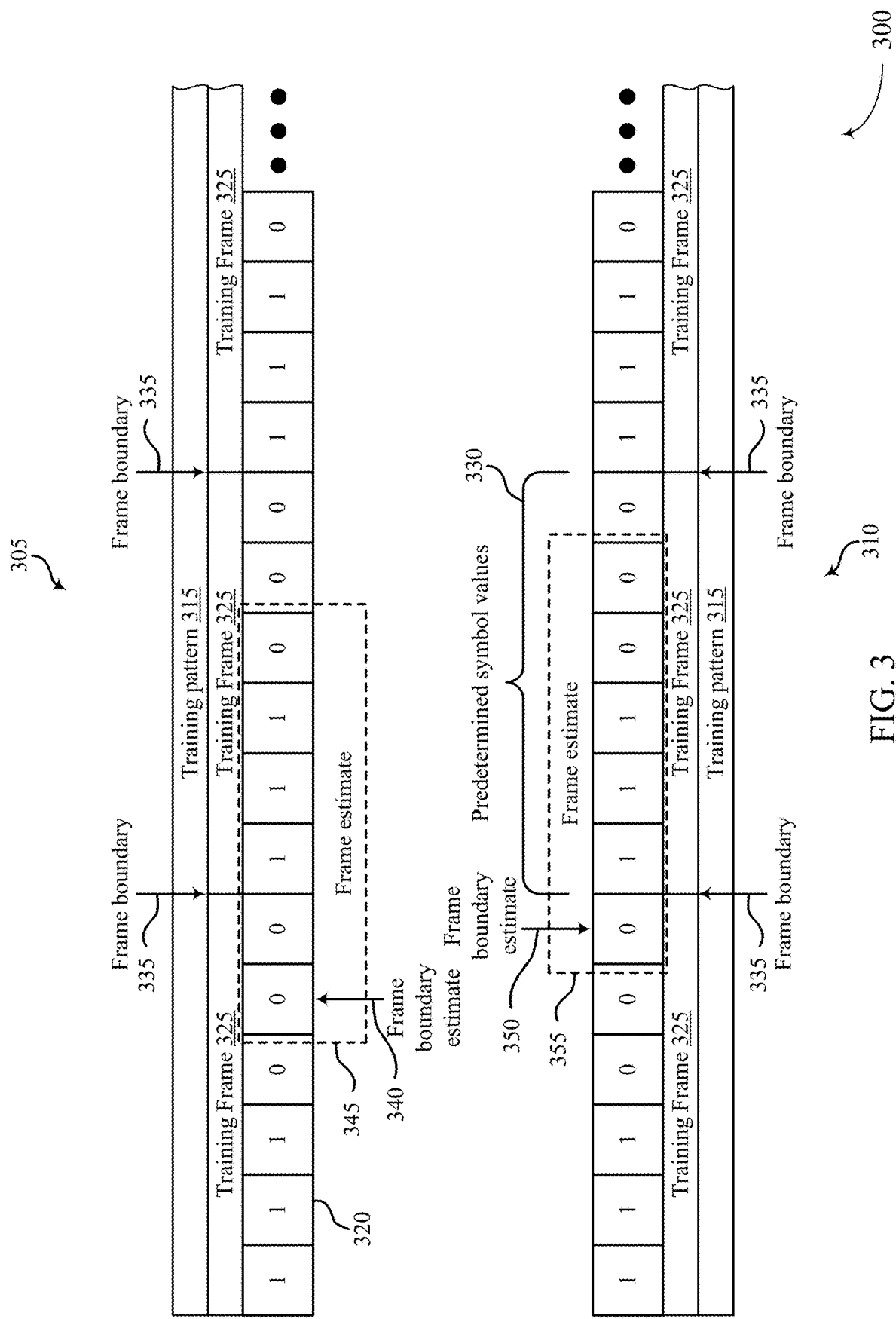
FIG. 3 illustrates an example of a structure that supports clock locking for frame-based communications of memory devices in accordance with examples as disclosed herein.

FIG. 3 illustrates an example of a structure 300 for a frame training procedure that supports clock locking for packet based communications of memory devices in accordance with examples as disclosed herein. The structure 300 shows two instances (e.g., first instance 305 and second instances 310) of a training pattern 315. Each instance 305, 310 shows a step in the frame training procedure (e.g., a frame synchronization procedure). A frame may refer to a unit of data communicated between a host device and a memory device. The frame may include a quantity of bits communicated after an identified frame boundary. In some cases, a frame may be referred to as a packet.

The frame training procedure is a process by which the memory device identifies a correct frame boundary. With the frame boundary, the memory device may generate a frame clock, which is used to identify frame boundaries (i.e., the start and stop of a frame) during an entire active session. The frame clock may be based on a system clock, a symbol length, and a frame length. In some examples, the system clock may be a write clock (WCK) at a host device. In some cases, the frame clock is a virtual clock that relies on the system clock for its timing. In other cases, the frame clock is a physical clock that is initialized to track the frames.

The training pattern 315 comprises a long train of symbols 320 that are set to predetermined symbol values used to identify a frame boundary. The training pattern 315 may comprise a plurality of training frames 325, each training frame 325 comprising an ordered set of predetermined symbol values 330. An example of the symbol values may be a set of logic '1's followed by a set of logic '0's, or vice versa. The training frame 325 may have a frame length that is equal to a frame length of the frames transmitted by the host device during the active session. Using a plurality of training frames, the memory device may be configured to determine a frame boundary 335 and generate a frame clock that is used to identify the beginning of frames (or the end as the case may be) during the active session.

During the activation time period and as part of a frame training procedure, the host device may transmit the training pattern 315 to the memory device. The memory device may determine when the training pattern is being transmitted so that it may be ready to initialize the frame training procedure.

As shown in the first instance, 305, upon receiving the training pattern 315, the memory device identify a symbol of the training pattern as a first frame boundary estimate 340. Using the first frame boundary estimate and/or a known frame length, the memory device may generate a first frame estimate 345. The first frame estimate 345 include a quantity of symbols of the training pattern 315 equal to the frame length of a training frame 325. The memory device may identify the ordered set of symbols of the first frame estimate 345. The memory device may compare the ordered set of symbols of the first frame estimate 345 to the ordered set of predetermined symbol values 330.

If the ordered set of symbols of the first frame estimate 345 matches the ordered set of predetermined symbol values 330, the memory device may identify the rising edge of the symbol that comprises the first frame boundary estimate 340 as the frame boundary. If the sets do not match, the memory device may generate a second frame boundary estimate 350 and a second frame estimate 355 as shown in the second instance 310. The memory device may then repeat the same process of comparing the set of symbol values in the second frame estimate 355 to the ordered set of predetermined symbol values 330. This process may continue until a correct frame boundary is found.

In some cases, the difference between the first frame boundary estimate 340 and the second frame boundary estimate 350 may be one symbol. In such cases, the memory device may slip the boundary estimate one symbol upon determining that the frame boundary is not correct. In other cases, the memory device may select the second frame boundary estimate 350 based on a predetermined symbol distance (e.g., one, two, three, four, five, six symbols, etc.). In some cases, the memory device may select the second frame boundary estimate based on the ordered set of symbol values found in the first frame estimate 345. For example, if the memory device knows that the predetermined set of symbol values is 111000 and the set of symbol values of the first frame estimate 345 is 001110, the memory device may identify the third symbol of the first frame estimate 345 as the second frame boundary estimate 350.

Once the memory device identifies the correct frame boundary, the memory device may generate a frame clock based on the frame synchronization process. The frame clock may indicate the beginning of a new frame through the active session. Using the frame clock, the memory device and the host device may not need to use headers to indicate the location of frames, thereby freeing up more symbols for substantive data. In some cases, the frame boundary may be aligned with a rising edge of a first symbol (or a first symbol period) in the frame. As such, the frame clock may also be aligned with a rising edge of the symbol period of the frame.

In some examples, a memory controller may generate a first frame clock (e.g., a reference frame clock) and one or more frames of data aligned to the first frame clock. Components of a memory device (e.g., a memory device 110) may receive the one or more frames of data from the memory controller and align the frames of data to a second frame clock generated at the memory device. For example, the memory device may perform a frame training procedure associated with the first frame clock and the second frame clock in order to accurately receive and decode the frames of data with a reduced chance of communication errors. The memory controller may also receive data from the memory device. In some examples, the memory controller may include components configured to generate a third frame clock for performing an associated frame synchronization procedure. In some other examples, the memory controller may include different components to receive and decode the data from the memory device, such as a delay-locked loop circuit. Additionally or alternatively, the techniques described herein may provide for the memory device and/or the memory controller to transmit a first clock pattern during a first time period (e.g., a full rate clock pattern to ensure more reliable communications during an active time period) and a second clock pattern during a second time period (e.g., a frame clock pattern to provide enhanced power savings during an idle time period).

Figure 4:
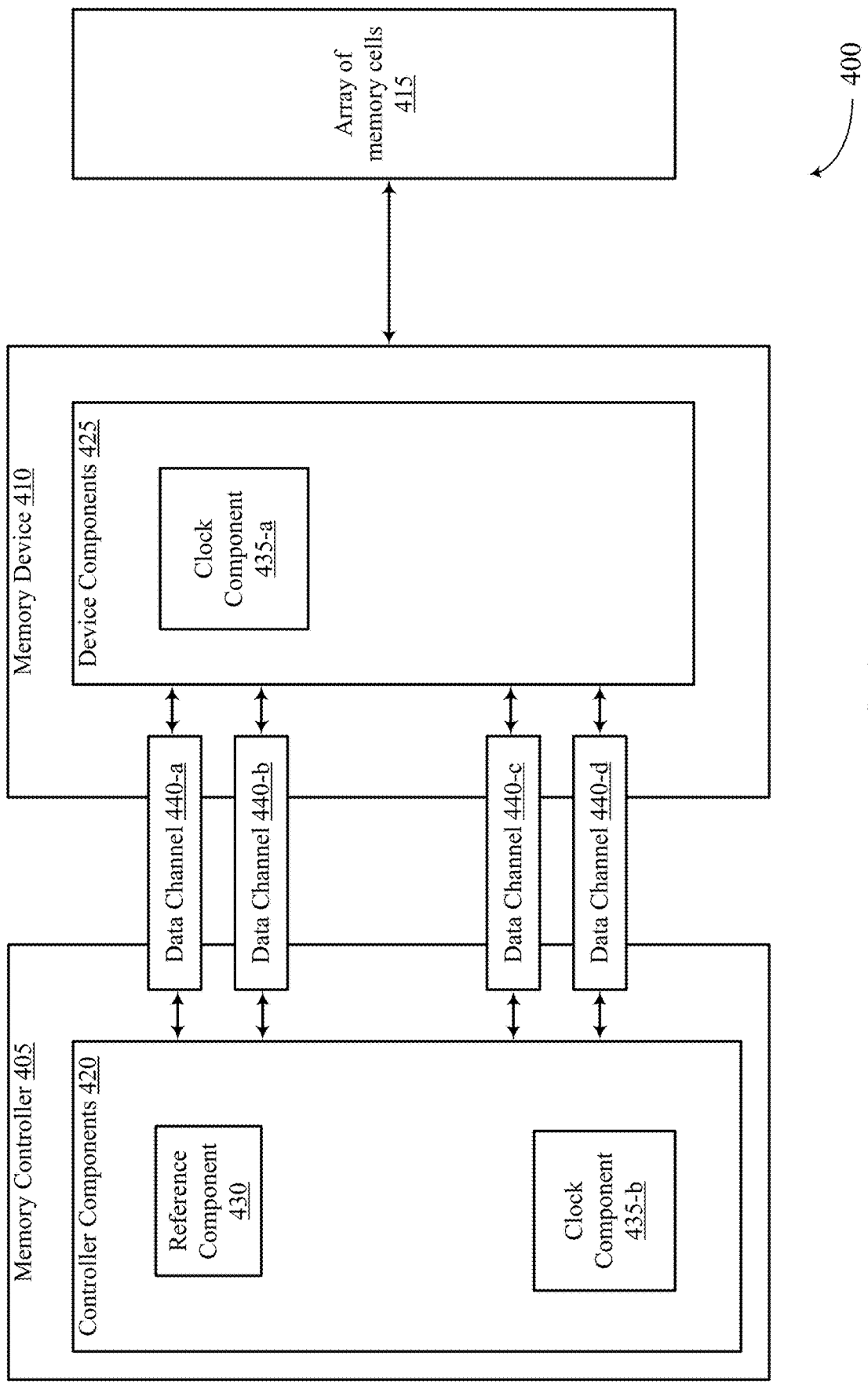
FIG. 4 illustrates an example of a block diagram of a memory system that supports clock locking for frame-based communications of memory devices in accordance with examples as disclosed herein.

FIG. 4 illustrates an example block diagram of a memory system 400 that supports devices and methods for clock locking for packet based communications of memory devices in accordance with examples as disclosed herein. The memory system 400 may include a memory controller 405. The memory controller 405 may be an example of a memory controller described herein, such as a memory controller of a host device 105, a memory controller of a memory device 110, etc. The memory system 400 may also include a memory device 410. The memory device 410 may be an example of a memory device as described herein, such as a memory device 110, a memory die 200, etc. The memory system 400 may also include an array of memory cells 415 in electronic communication with the various devices, controllers, and components as described herein. Although the various devices and components of the memory system 400 are illustrated as separate for illustrative clarity, it is to be understood that any device or component shown in the memory system 400 may be combined (e.g., the memory controller 405 and/or the array of memory cells 415 may be considered to be a part of the memory device), arranged in different locations, include different connections with each other, etc. In general, FIGS. 4-7 may illustrate an example of a first example of devices and methods for clock locking communications protocols as described herein.

The memory system 400 may include data channels 440. The data channels 440 may be examples of data channels 215 as described above with reference to FIG. 2. In some examples, the data channels 440 may be configured to transmit data to and from the memory controller 405 and the memory device 410 (e.g., bidirectionally between the memory controller 405 and the memory device 410). Although illustrated with four data channels 440 for illustrative clarity, there may be any quantity of data channels 440. For example, the memory system 400 may include a relatively high number of data channels 440 (e.g., one, two, three, four, five, six, seven, eight, nine, ten, eleven, twelve data channels, etc.). The memory system 400 may use frames to coordinate data communicates between the memory controller 405 and the memory device 410. In some cases latency of communications within the memory system 400 may result in communication errors between the memory device 410 and the memory controller 405. Such latency may be a result of the delay in time between an issuance of data from the memory controller 405 (e.g., a read or write command) and a reception of data at the memory controller 405 from the memory device 410 (e.g., read data of an address indicated by a read command). Such latency may also increase the chance of communication errors, for example, when the memory system 400 includes a relatively high number of data channels 440.

The techniques described herein may enable the memory device 410 and/or the memory controller 405 to identify the start, end, or other interval of one or more data frames based on a frame synchronization procedure (e.g., a frame training procedure as described with respect to FIG. 3). Such techniques may also enable the memory device 410 and/or the memory controller 405 to account for communication latency and reduce the chance of communication errors. For example, there may not be a common frame clock transmitted between the memory controller 405 and the memory device 410 that establishes data alignment for read data and/or write data based on latency. Such examples may result in an unknown or undesirable phase relationship between data packets aligned with a reference frame clock generated at the memory controller 405 and transmitted from the memory controller 405 to the memory device 410 and data packets transmitted from the memory device 410 to the memory controller 405 (e.g., read data packets). Accordingly, the various components described herein may enable the memory controller 405 and the memory device 410 to account for latency and align received data packets with one or more memory operations.

For example, the memory controller 405 may include controller components 420 configured to perform one or more memory operations. The controller components 420 may include a reference component 430. The reference component 430 may be a circuit configured to generate a reference frame clock for data communications to the memory device 410. When using data frames to communicate data, information may be packetized into different frames. The boundaries of the data frames may be based on the reference frame clock. Other controller components 420 may generate or receive command information (e.g., command packets) for performing a memory operation on the array of memory cells 415 (e.g., an access operation such as a read operation or a write operation). The command information may include a command to read one or more addresses of the array of memory cells 415, a command to write data to one or more addresses of the array of the memory cells 415, etc. The reference component 430 may generate a reference frame clock and the data frames may be aligned to the reference frame clock by one or more of the controller components 420.

The memory controller 405 may transmit the data frame (e.g., data packets including command information, such as a read command packet and an associated address packet) to the memory device 410 via one or more data channels 440, such as data channel 440-*a* and/or data channel 440-*b*. The memory controller 405 may transmit the data frames in accordance with the reference frame clock (e.g., a frame clock generated in a command timing domain at the memory controller 405 may be used to generate the data frames based on a period of the frame clock).

To align frame boundaries at both the memory controller 405 and the memory device 410, a frame synchronization procedure may be performed. For example, a frame synchronization procedure as described with reference to FIG. 3 may be performed. In some examples, the memory controller 405 may transmit one or more training frames (i.e., training frames) to the memory device 410. The memory device 410 may use the training frames to perform a frame synchronization procedure. For example, the memory device 410 may include device components 425. The device components 425 may include a clock component 435-*a* configured to generate a frame clock internal to the memory device 410 using a frame clock generation circuit. The clock component 435-*a* may also be configured to align the generated frame clock with the training frames transmitted from the memory controller 405 using a frame clock alignment circuit based on a frame synchronization. In some examples, the memory controller 405 may also transmit a clock signal to the memory device 410 (e.g., a full rate-clock) that may be used by the clock component 435-*a* to generate and/or align the frame clock. For example, the clock signal may indicate one or more unit intervals (UIs) of data communicated between the memory controller 405 and the memory device 410.

The memory device 410 may transmit one or more data frames to the memory controller 405 in response to the received data frame (e.g., data frame including command information, such as a read command). For example, the command information may include a read command and the memory device 410 may transmit read data as data frames to the memory controller 405 via data channels 440-*c* and 440-*d*. However, there may be a latency associated with such communications. For example, there may be a delay between transmitting the data frames from the memory controller 405 and receiving the data frames from the memory device 410, which may result in communication errors (e.g., due to a phase misalignment between the reference clock at the memory controller 405 and the frame clock generated at the memory device 410).

The controller components 420 may also include a clock component 435-*b*. The clock component 435-*b* may include a frame clock generation circuit and a frame clock alignment circuit. The frame clock generation circuit may be configured to generate a frame clock at the memory controller 405 and the frame clock alignment circuit may be configured to align the frame clock to data frames received from the memory device 410 (e.g., data frames including read data transmitted in response to a read command). In some examples, the clock component 435-*b* may receive a clock signal from the memory device 410, such as a return clock (RCK) signal (e.g., associated with a return clock aligned with data transmitted from the memory device 410). The clock component 435-*b* may use the clock signal to generate the frame clock and/or align the frame clock to the received data frames. For example, the clock component 435-*b* may use the clock signal as part of a frame alignment procedure (e.g., to align edges of an RCK to the center of a unit interval (UI) of the received data).

Figure 5A:
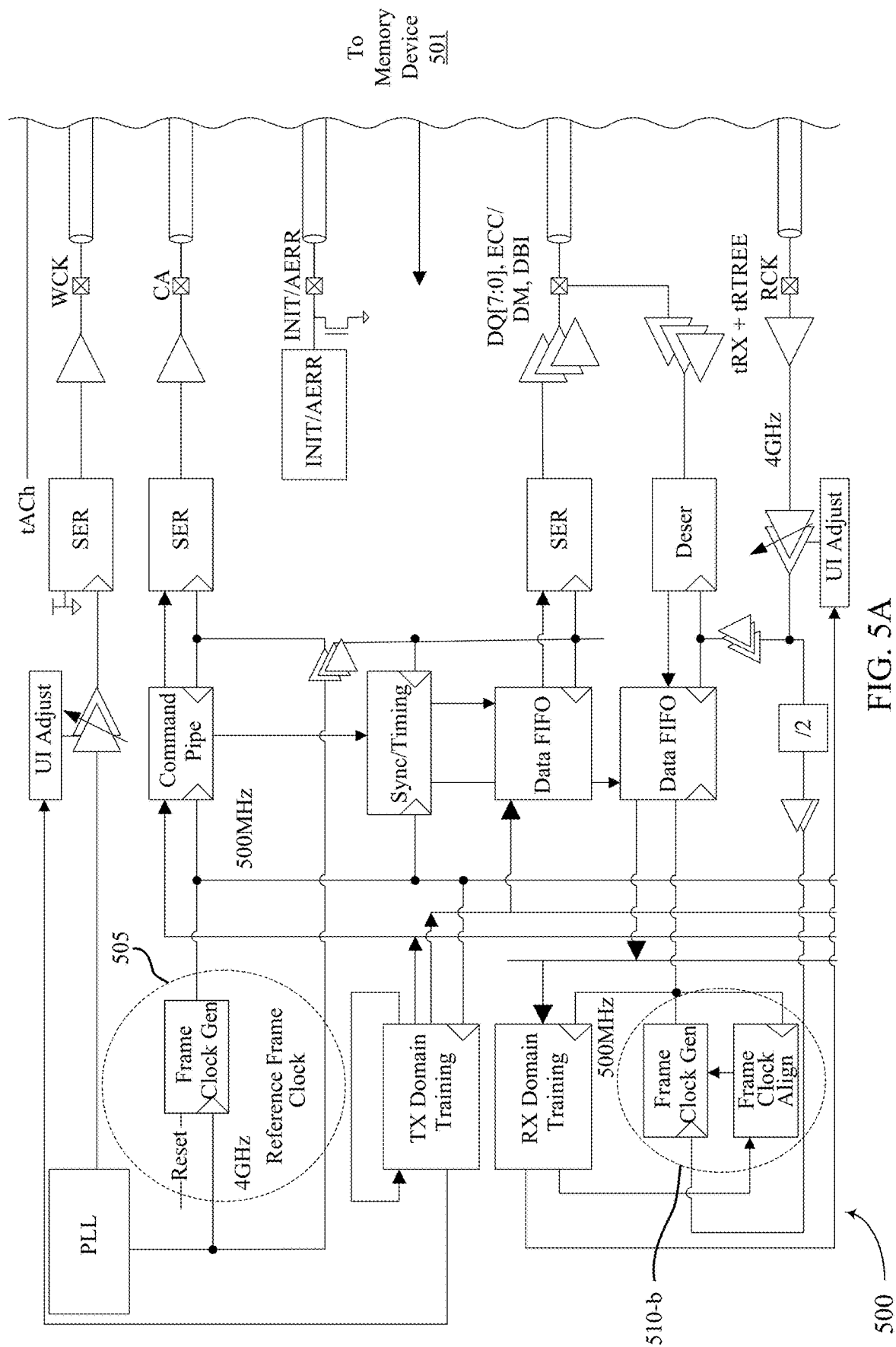
FIGS. 5A and 5B illustrate examples of block diagrams that support clock locking for frame-based communications of memory devices in accordance with examples as disclosed herein.
Figure 5B:
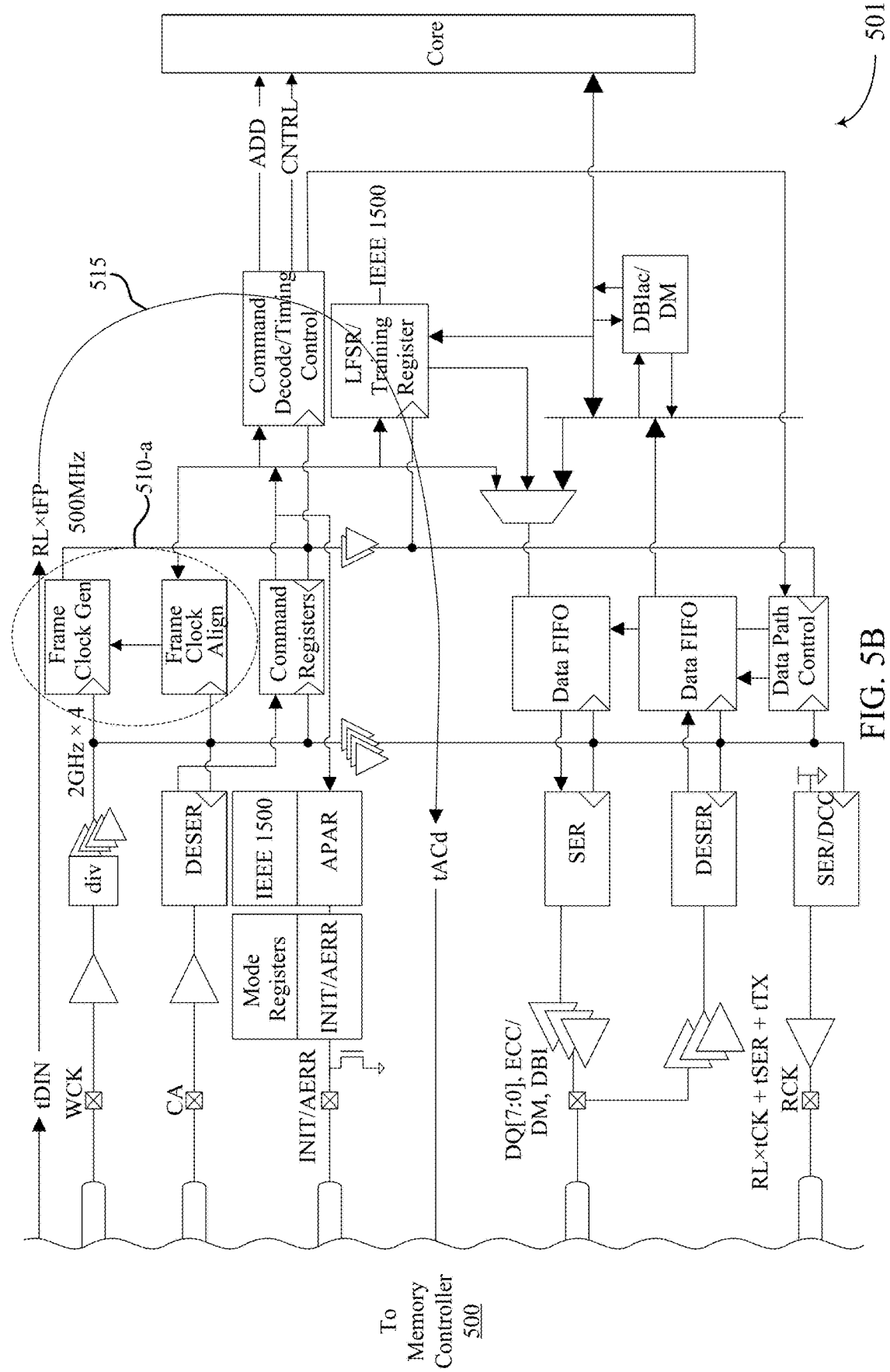

FIG. 5A and FIG. 5B illustrate examples of block diagrams of a memory controller 500 and a memory device 501, respectively, that support clock locking for packet based communications of memory devices in accordance with examples as disclosed herein. The memory controller 500 may illustrate a block diagram of one or more memory controllers as described herein, such as a memory controller 405, a memory controller of a host device 105, a memory controller of a memory device 110, etc. The memory device 501 may illustrate a block diagram of one or more memory devices described herein, such as a memory device 110 (e.g., DRAM), a memory die 200, a memory device 410, etc. Although the various devices and components of FIGS. 5A and 5B are illustrated on separate sheets for illustrative clarity, any device or component may be combined, arranged in different locations, include different connections between each other, may include additional components or circuitry, or may not include some of the shown components or circuitry.

In some memory systems described herein, a reference frame clock may be generated at the memory controller 500 of the memory system (e.g., using the reference component 430 as described in FIG. 4). In some examples, a training algorithm may be used to align the interface of a memory device 501 (e.g., a DRAM interface) to a cadence of the reference frame clock, such as the training procedure described herein with reference to FIG. 3. The reference frame clock may be recreated internally at the memory device 501 without having to transmit the actual frame clock from the memory controller 500 to the memory device 501 (e.g., via one or more frame generation circuits at the memory device 501). In some cases, frame may refer to a periodic beginning and end of a packet and a packet may be referred to as the data fields included in a frame period of the frame.

One or more frames of data may communicate command information. For example, the frame of data may correspond to a command packet. The command packet may include varying data field sizes based on which command is being signaled (e.g., to the memory device 501 from the memory controller 500), such as a read command, write command, refresh command, among other examples of commands. In some examples, an address field for an activate command may be thirteen bits and the address field for a column command may be six bits. Thus, data fields within a packet may vary in size, but in some cases the overall packet size may be maintained based on a frame clock period. In such cases, there may be unused data fields in the field, and the unused data fields may be reassigned for a new purpose or remain unused for a particular command. Packet size may be limited by the width of a data and/or command bus, a quantity of Us (e.g., bit-time) within a frame, or both. However, such schemes may be relatively inefficient and may reduce the overall bandwidth of communications in a memory system, for example, due to signaling overhead associated with indicating the start and/or end of a frame (e.g., flow control bits included in a packet). Accordingly, the described techniques enable devices and/or components of the memory system to utilize periodic frames established, for instance, through a channel initialization algorithm (e.g., an initialization algorithm of a training procedure). The timing of the frame may be continuously maintained between a memory device 501 and a memory controller 500 of the memory system. The memory device 501 may act on each field (i.e., perform one or more memory operations such as access operations) based on decoded bit patterns in the frame of data (e.g., based on control information such as a command field of a command packet).

In some examples, there may be latency associated with the communications in the memory system. For example, there may be a delay of time between the issuance of a command (e.g., a read command or a write command) from the memory controller 500 to the memory device 501 and the reception of data from the memory device 501 to the memory controller 500 (e.g., when data is presented on the bi-directional data bus (e.g., presented by a signal transmitted via DQ pins)). In some examples, a frame period for communications may be fixed and the timing granularity for commands and/or data may be measured in frame clock periods. In such examples, the memory controller 500 may also establish a common frame period for receiving read data from the memory device 501 separate from the reference frame clock used to transmit one or more frames (e.g., frames including commands, command information, data, etc.) at the memory controller 500. In some cases, there may not be a common clock (e.g., a clock signal that establishes data alignment between read and/or write data based on latency) transmitted between the memory controller 500 and the memory device 501, for example, to reduce signaling overhead and increase the bandwidth and data rate of communications in the memory system. In such cases, the reference frame clock generated at the memory controller 500 may have a random phase relationship with the frame clock used for transmitting one or more frames (e.g., indicating read data packets) from the memory device 501 to the memory controller 500. Such a random or otherwise unknown phase relationship may result in communications errors due to latency being relatively unaccounted for when decoding the one or more frames (e.g., frames indicating data without headers or other information indicating the start and/or the end of a data frame). In some examples, the latency may be relatively difficult to account for in the memory system. For instance, it may be relatively difficult to accurately align frames (e.g., including read data packets) transmitted to the memory controller 500 in accordance with latency tracking. That is, latency in communications and/or frame timing (e.g., the frame cycle where a data transmission starts or ends) may be difficult to determine, for instance, due to the unknown phase alignment between an output clock (e.g., a return clock) at the memory device 501 and the reference frame clock at the memory controller 500.

Accordingly, the techniques described herein may provide for one or more components, methods, and/or devices to account for latency while enabling relatively high data rates and communications. For example, the memory controller 500 may illustrate several components to implement the frame period communications as described herein, however, there may be additional components or less components than illustrated. The memory device 501 may also illustrate several components to implement the frame period communications as described herein, however, it is also to be understood that there may be additional or less components than illustrated.

In some examples, the circled areas of FIGS. 5A and 5B may include circuit blocks configured to generate one or more frame clocks. For example, the circled area 505 may include a frame clock generation circuit, denoted as Frame Clock Gen in FIG. 5A, configured to generate a reference frame clock. The reference frame clock may have a starting time and may be based on a full-rate data clock generated by a phase-locked loop (PLL) or by other examples of clock synthesis circuits on the memory controller 500. As an example, the PLL may be a control system with circuitry configured to generate the full-rate data clock, such as an electronic circuit including a variable frequency oscillator, a phase detector, a feedback loop, etc., which may result in an output signal with a phase associated with the phase of an input signal. In some examples, the PLL may also generate the reference frame clock and may be included in the circled area 505. In some cases, the reference frame clock may establish a frame period and/or boundaries for data or information transmitted to the memory device 501 (e.g., command and data packets transmitted in the write direction by one or more frames).

The circled area 510-*a* may include components on the memory device 501 corresponding to frame clock generation and/or frame clock alignment circuits. For example, following UI training (e.g., bit alignment across a command and data bus) a channel initialization period may align an internal frame clock of the memory device 501 with training packets transmitted by the controller. That is, such circuits may align an internally generated frame clock of the memory device 501 to incoming training packets transmitted from the controller. Upon alignment of the frame clock of the memory device 501, the memory device 501 may transmit an indication back to the controller using a static value driven from a data signal (e.g., a DQ signal) or an error detect signal, among other examples (e.g., transmitting the indication by reading a control register through a side channel). Additionally or alternatively, the memory controller 500 may transmit training packets for a specified length of time, which may result in a relatively high probability of a frame clock lock. In such examples, the frame clock lock may be checked (e.g., verified) through side channel access.

The circled area 510-b may include components on the memory controller 500 corresponding to frame clock generation and/or frame clock alignment circuits. For example, the circled area 510-b may include similar components as described with reference to circled area 510-a. The circled area 510-b may enable the memory controller 500 to accurately align received data frames from the memory device 501 in accordance with a first example described in FIGS. 4-7.

In some examples, communications between the memory device 501 and the memory controller 500 may include latency. For example, circuit path delay 515 illustrates a delay path of a read command and subsequent read data transmissions. The latency may include time associated with one or more operations. For example, the latency may include a delay segment associated with transmitting a controller output path to the memory device 501 (e.g., denoted as tACh). Additionally or alternatively, the latency may include a delay for a packet to be received and deserialized (e.g., denoted as tDIN in FIG. 5B), for example, by the deserializing block (denoted as DESER) described with reference to FIG. 5B. In some examples, the latency may also include a discrete, programmed latency which may be programmed in a mode register of the memory device 501. In such examples, the discrete programmed latency may be labelled as RL*tFP, where RL may represent the read latency in frame clock periods (e.g., RL may be a programmed value) and tFP may represent a period of a frame clock (e.g., 16 UI). Such a discrete programmed latency may mask one or more variations in circuit delays to access data from the memory array. In some examples, the memory device 501 and the memory controller 500 may include one or more data first in first out (FIFO) blocks. The one or more data FIFO blocks may be configured to compensate for any timing slack (e.g., timing misalignment) between an array access operation and any resulting data output. In some examples, the latency may additionally or alternatively include a clock-to-output delay associated with read data transmitted from the memory device 501 to the memory controller 500 (e.g., denoted as tACD). In some cases, the techniques and devices described herein may be configured to consider some or all of the latency and align one or more operations of the memory systems to a frame clock in accordance with the latency (e.g., using at least the components of the circled area 510-b).

Figure 6:
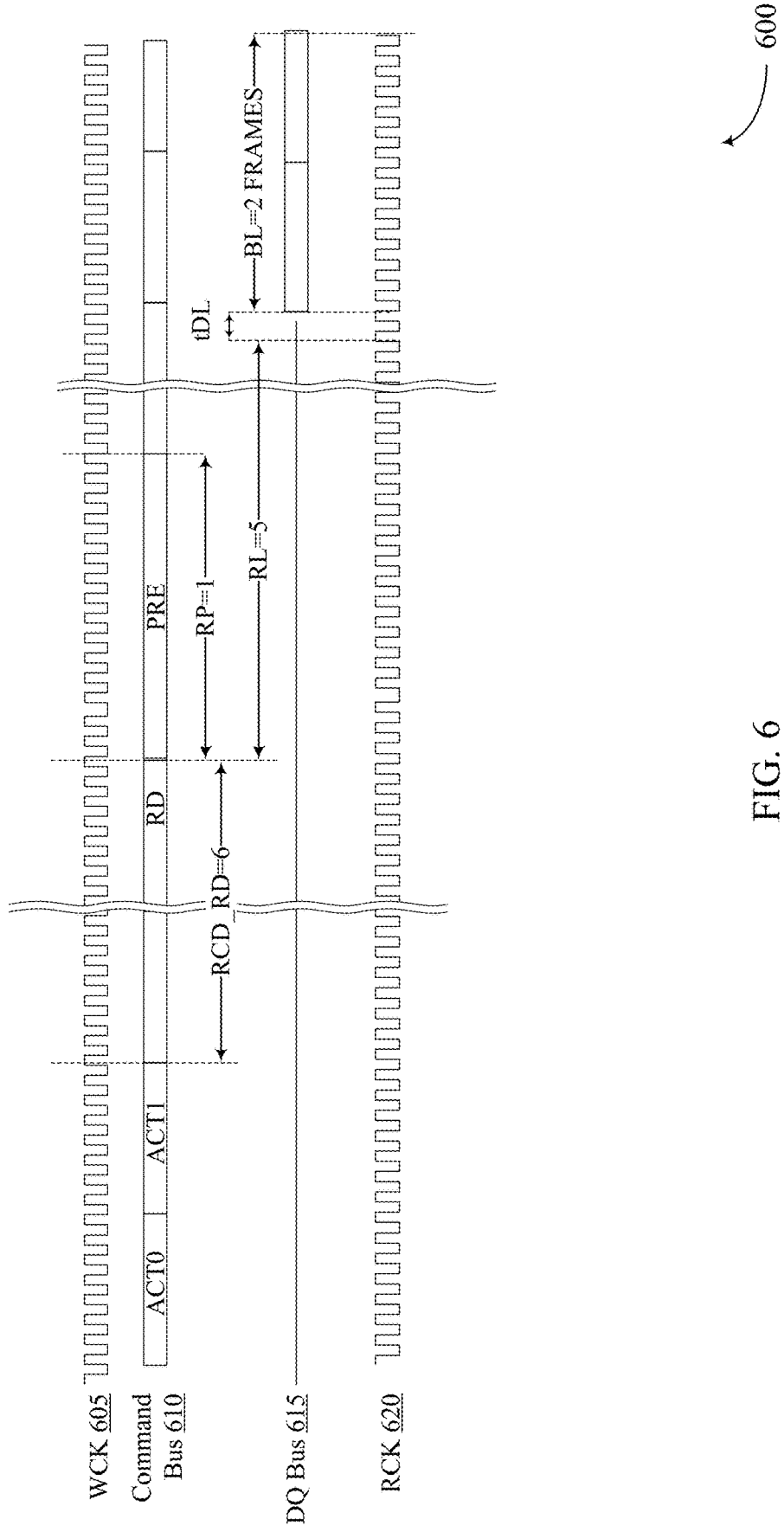
FIG. 6 illustrates an example of a timing diagram that supports clock locking for frame-based communications of memory devices in accordance with examples as disclosed herein.

FIG. 6 illustrates an example of a timing diagram 600 that supports clock locking for packet based communications of memory devices in accordance with examples as disclosed herein. Generally, the timing diagram 600 may illustrate an example of a read access operation from the perspective of one or more input pins of a memory device (e.g., the memory device 501). The timing diagram may include illustrative examples of signals, specifically signals corresponding to a WCK 605, a command bus 610, a DQ bus 615, and an RCK 620.

Latency may exist in communications between a memory device and a memory controller of a memory system. For example, a read data latency may be a period of time between the transmission of a read command from the memory controller (e.g., via one or more frames transmitted to the input pins of the memory device) and the arrival of data (e.g., on the DQ bus with reference to FIG. 5A) from an array of memory cells of the memory device. In some examples, the read data latency may include a discrete latency (e.g., denoted as 'RL=5' with reference to FIG. 6). The discrete latency may include a deterministic delay measured in frame clock cycles and may be intended to mask a variable memory array access delay (e.g., denoted as tAA with reference to FIG. 7). The read data latency may also include a total read data latency (e.g., denoted as tDL with reference to FIG. 6). The total read data latency may be a result of delay through input and/or output circuits for the memory controller and the memory device. The read data latency may also include several other latency or delay segments, as illustrated and discussed with respect to FIGS. 5A and 5B.

Techniques and devices described herein may implement a communication protocol where a full-rate clock (e.g., a write clock illustrated by WCK 605) may be transmitted between the memory controller and the memory device to synchronize the capture (e.g., reception and/or decoding) of command information, data UIs (e.g., symbols), and the like. For example, one or more symbols of a frame may be captured, and the captured symbols may form a communication packet, such as command packet. In some cases, read data transmitted from the memory device (e.g., as one or more frames) may not have a defined timing relationship with the full-rate clock or a defined relationship to the reference frame clock (e.g., to realize more efficient communications). In some cases, the reference frame clock may be implied by the period of one or more command frames (e.g., a command packet period). The one or more command frames may be demarcated by the cadence of the reference frame clock generated by the memory controller. The delay for data from the end of discrete programmed latency (e.g., labeled tDL with reference to FIG. 6) may be a result of input and output delay from the round trip of a command transmitted from the memory controller to the memory device and data transmitted to the memory controller from the memory device in response to the command.

The RCK signal may be transmitted from the memory device to the memory controller (e.g., in parallel with data output from the memory device). The RCK signal may indicate a return clock that is aligned with DQ data transmitted from the memory device. The RCK signal may be treated by the memory device as another data output signal and the RCK signal may also have a known transmitted pattern (e.g., a pre-configured pattern). The RCK signal may behave as a clock and toggle at the system data rate. The RCK signal may be used at an input of the memory controller to capture the DQ data (e.g., correctly align one or more frames). For example, the memory controller may train a delay adjustment during channel initialization to align edges of the RCK to the center of the data UI. In some cases, there may be a clock distribution delay for the RCK signal in the memory controller (e.g., denoted as tCDHNh in FIG. 7). A clock edge aligned to a first UI at the output of the memory device may be different than a clock edge that is aligned to the first UI at the memory controller data latch as a result of one or more latencies (e.g., the tCDHNh), which may account for latency and ensure more reliable communications.

Figure 7:
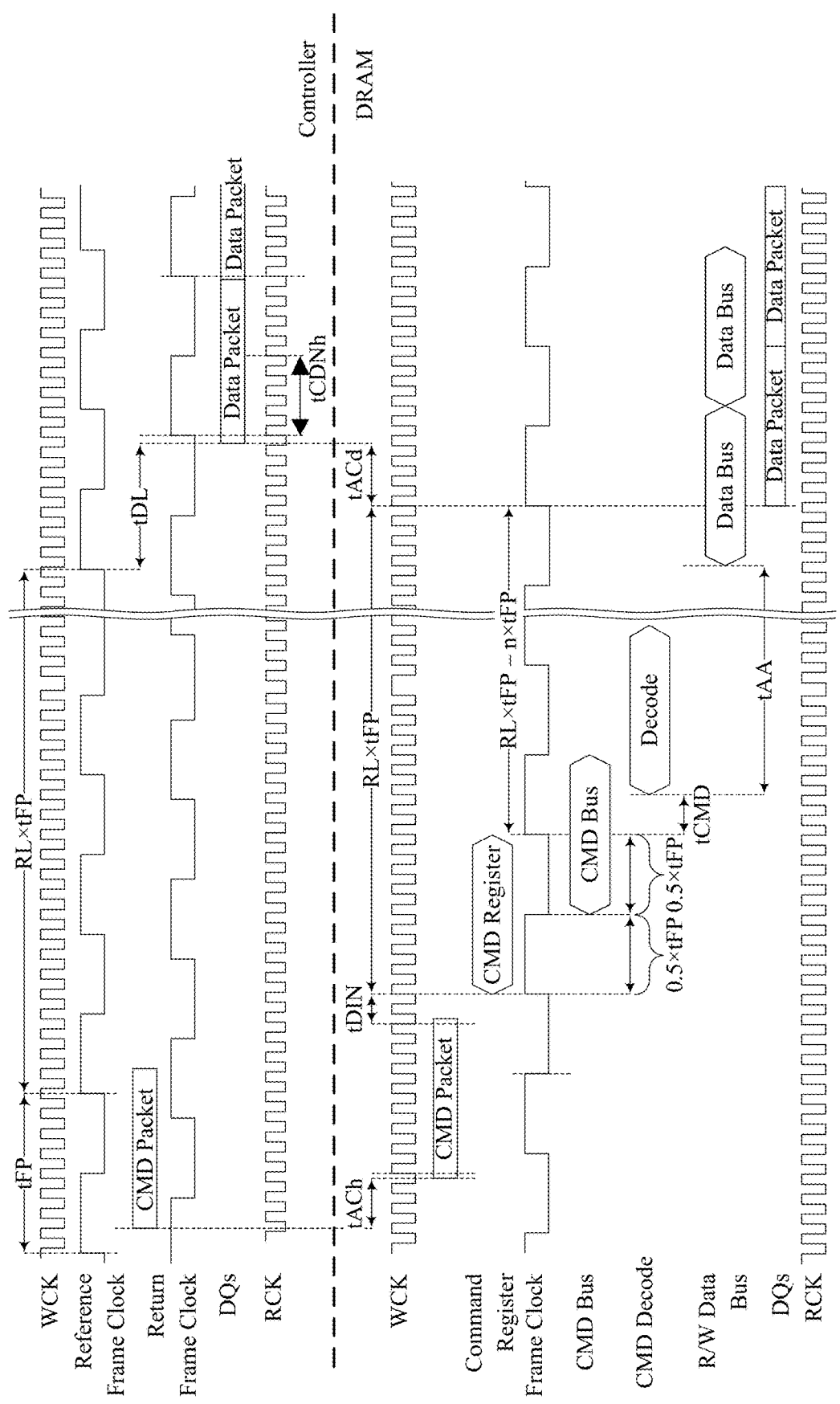
FIG. 7 illustrates an example of a timing diagram that supports clock locking for frame-based communications of memory devices in accordance with examples as disclosed herein.

FIG. 7 may illustrate a timing diagram 700 that supports devices and methods for clock locking for packet based communications of memory devices in accordance with examples as disclosed herein. The timing diagram 700 may be associated with FIGS. 5A and 5B. For example, the timing diagram 700 may illustrate an example of one or more memory operations, such as a command issuance, a read operation based on the command, one or more frame alignments procedures, one or more signal transmissions and communications, among other examples of memory operations in a memory system.

The timing diagram 700 may be an example of a system implementing a continuous RCK signal. For example, a clock component (e.g., the clock component 435-b, the circled area 510-b, among other examples of clock components) may be included in the memory controller. The clock component of the memory controller may include similar features or circuits as the clock component of the memory device and may utilize the continuous RCK signal in order to maintain alignment between one or more frames (e.g., data packets) transmitted from the memory controller on the DQ bus. The clock component of the memory controller (i.e., the frame clock generation circuit) may be initialized with a training pattern received from the memory device. The training pattern may originate from a training register or pattern generator on the memory device (e.g., labeled as LFSR/Training register with reference to FIG. 5B). Additionally or alternatively, the pattern may originate from a loopback path where the memory controller drives the training pattern (e.g., with the transmission of command information to the memory device). In such cases, the training pattern may be received on the DQ bus after passing through the delay of the input/output circuit paths, which may enable accurate frame synchronization for the frame clock generated by the clock component.

In some examples, an RCK preamble may also provide valid clock edges to capture data, for example, without having to compensate for the clock distribution delay at the memory controller (e.g., tCDNh). Such a delay and corresponding signals are illustrated by the timing diagram 700 for clarity.

Figure 8:
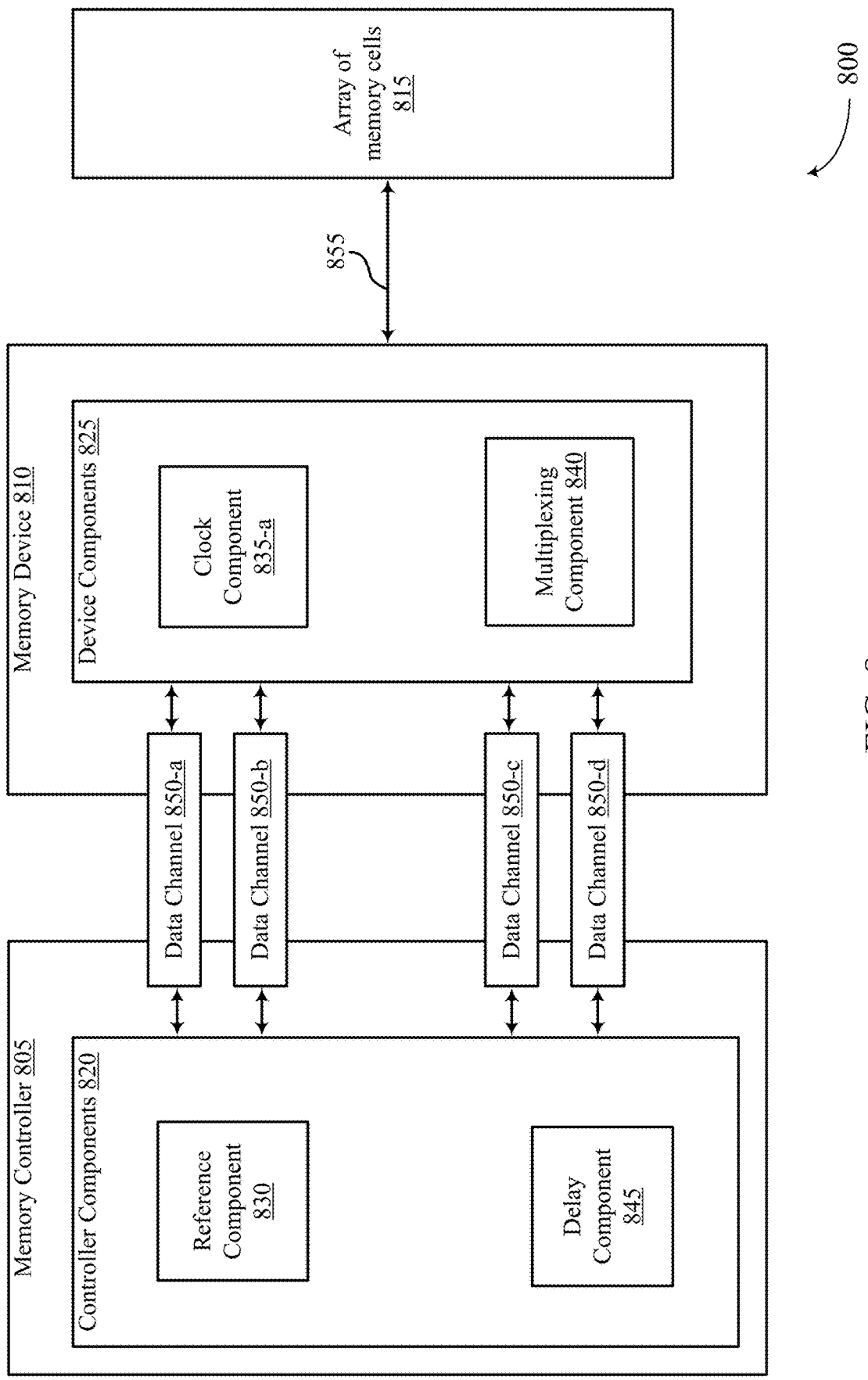
FIG. 8 illustrates an example of a block diagram of a memory system that supports clock locking for frame-based communications of memory devices in accordance with examples as disclosed herein.

FIG. 8 illustrates an example block diagram of a memory system 800 that supports devices and methods for clock locking for packet based communications of memory devices in accordance with examples as disclosed herein. The memory system 800 may include a memory controller 805. The memory controller 805 may be an example of a memory controller described herein, such as a memory controller of a host device 105, a memory controller of a memory device 110, a memory controller 405, etc. The memory system 800 may also include a memory device 810. The memory device 810 may be an example of a memory device as described herein, such as a memory device 110, a memory die 200, a memory device 410, etc. The memory system 800 may also include an array of memory cells 815 in electronic communication with the various devices, controllers, and components, which may be an example of the array of memory cells 415 as described with reference to FIG. 4. Although the various devices and components of the memory system 800 are illustrated as separate for illustrative clarity, it is to be understood that any device or component shown in the memory system 800 may be combined (e.g., the memory controller 805 and/or the array of memory cells 815 may be considered to be a part of the memory device), arranged in different locations, include different connections with each other, etc. In general, FIGS. 8-11 may illustrate an example of a second example of devices and methods for clock locking communications protocols as described herein.

The memory system 800 may include data channels 850. The data channels 850 may be examples of data channels 215 or data channels 440 as described with reference to FIGS. 2 and 4, respectively. In some examples, the data channels 850 may be configured to transmit data to and from the memory controller 805 and the memory device 810 (e.g., including the array of memory cells 815). Although illustrated with four data channels 850 for illustrative clarity, there may be any quantity of data channels 850. For example, the memory system 800 may include a relatively high number of data channels 850 (e.g., one, two, three, four, five, six, seven, eight, nine, ten, eleven, twelve data channels, etc.). The memory system 800 may use frames to coordinate data communications between the memory controller 805 and the memory device 810. In some cases latency of communications within the memory system 800 may result in communication errors between the memory device 810 and the memory controller 805. Such latency may be a result of the delay in time between an issuance of data from the memory controller 805 (e.g., a read or write command) and a reception of data at the memory controller 805 from the memory device 810 (e.g., read data of an address indicated by a read command). Such latency may also increase the chance of communication errors, for example, when the memory system 800 includes a relatively high number of data channels 850.

The techniques described herein may enable the memory device 810 and/or the memory controller 805 to identify the start or end of one or more data frames based on a frame synchronization procedure (e.g., a frame training procedure as described with respect to FIG. 3). Such techniques may also enable the memory device 810 and/or the memory controller 805 to account for communication latency and reduce the chance of communication errors. For example, there may not be a common frame clock transmitted between the memory controller 805 and the memory device 810 that establishes data alignment for read data and/or write data based on latency. Such examples may result in an unknown or undesirable phase relationship between data packets aligned with a reference frame clock generated at the memory controller 805 and transmitted from the memory controller 805 to the memory device 810 and data packets transmitted from the memory device 810 to the memory controller 805 (e.g., read data packets). Accordingly, the various components described herein may enable the memory controller 805 and the memory device 810 to account for latency and align received data packets with one or more memory operations.

For example, the memory controller 805 may include controller components 820 configured to perform one or more memory operations. The controller components 820 may include a reference component 830. The reference component 830 may be a circuit configured to generate a reference frame clock for data communications to the memory device 810. For example, other controller components 820 (not shown) may generate or receive data frames for performing a memory operation on the array of memory cells 815 (e.g., a command packet including a command for an access operation such as a read operation or a write operation). The data frames may include command information such as read command information (e.g., a command to read one or more addresses of the array of memory cells 815) or write command information (e.g., a set of data to write to one or more addresses of the array of memory cells 815). The reference component 830 may generate a reference frame clock and the data frames may be aligned to the reference frame clock by one or more of the controller components 820.

The memory controller 805 may transmit the data frames (e.g., data packets including a read command packet and an associated address packet) to the memory device 810 via one or more data channels 850, such as data channel 850-*a* and/or data channel 850-*b*. The memory controller 805 may transmit the data frames in accordance with the reference frame clock (e.g., a frame clock generated in a command timing domain at the memory controller 805 may be used to generate the data frames based on a period of the frame clock). In some examples, the memory controller 805 may also transmit one or more training frames to the memory device 810. The memory device 810 may use the training frames to perform a frame synchronization procedure. For example, the memory device 810 may include device components 825. The device components 825 may include a clock component 835-*a* configured to generate a frame clock internal to the memory device 810 using a frame clock generation circuit. The clock component 835-*a* may also be configured to align the generated frame clock with the training frames transmitted from the memory controller 805 using a frame clock alignment circuit based on a frame synchronization procedure as described herein with reference to FIG. 3. In some examples, the memory controller 805 may also transmit a clock signal (e.g., a full rate-clock) to the memory device 810 that may be used by the clock component 835-*a* to generate and/or align the frame clock. For example, the clock signal may indicate one or more Us of data communicated between the memory controller 805 and the memory device 810.

The memory device 810 may transmit one or more data frames and/or data packets to the memory controller 805 in response to the received data frames. For example, the data frames may include a read command and the memory device 810 may transmit read data as data frames to the memory controller 805 via data channels 850-*c* and 850-*d*. In some examples, the device components 825 may also include a multiplexing component 840. The multiplexing component 840 may include a multiplexing circuit in a clock signal output path (e.g., an output path of an RCK signal from the memory device 810). The multiplexing component 840 may be configured to switch a data pattern of the clock signal between a full rate clock pattern and a frame clock pattern. For example, the memory device 810 may transmit a full rate clock pattern to the memory controller 805 (e.g., along with transmitting read data via one or more data frames) and the memory device 810 may transmit a frame clock pattern of the clock signal during idle periods. By transmitting the frame clock pattern during idle periods, the memory device may reduce a power consumption as compared with transmitting the RCK signal during the idle periods.

In some examples, the controller components 820 may also include a delay component 845. The delay component 845 may be an example of a delay locked loop circuit. For example, the delay component 845 may be configured to phase align a frame clock (e.g., the reference frame clock at the memory controller 805) to an indication of the frame clock of the memory device 810 (e.g., a transmitted version of the frame clock generated at the memory device 810 via an RCK signal). The phase aligned frame clock may thus be aligned to data packets (e.g., read data transmitted in response to a read command via one or more frames) due to the delay component 845. In some examples, the phase alignment procedure at the delay component 845 may be based on the clock signal received from the multiplexing component 840 (e.g., the RCK signal pattern may be used as an input to the delay locked loop circuit).

Figure 9A:
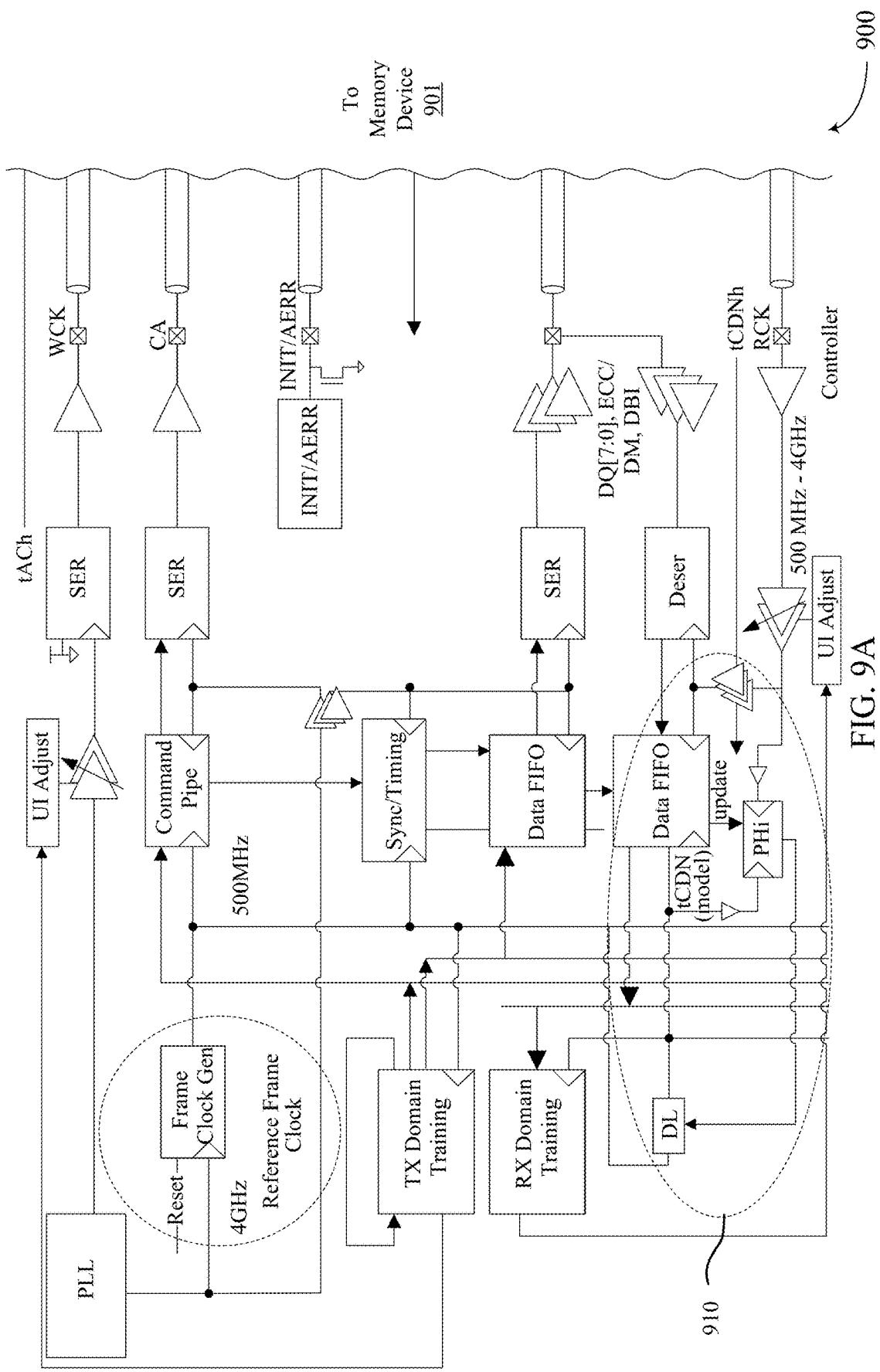
FIGS. 9A and 9B illustrate examples of block diagrams that support clock locking for frame-based communications of memory devices in accordance with examples as disclosed herein.
Figure 9B:
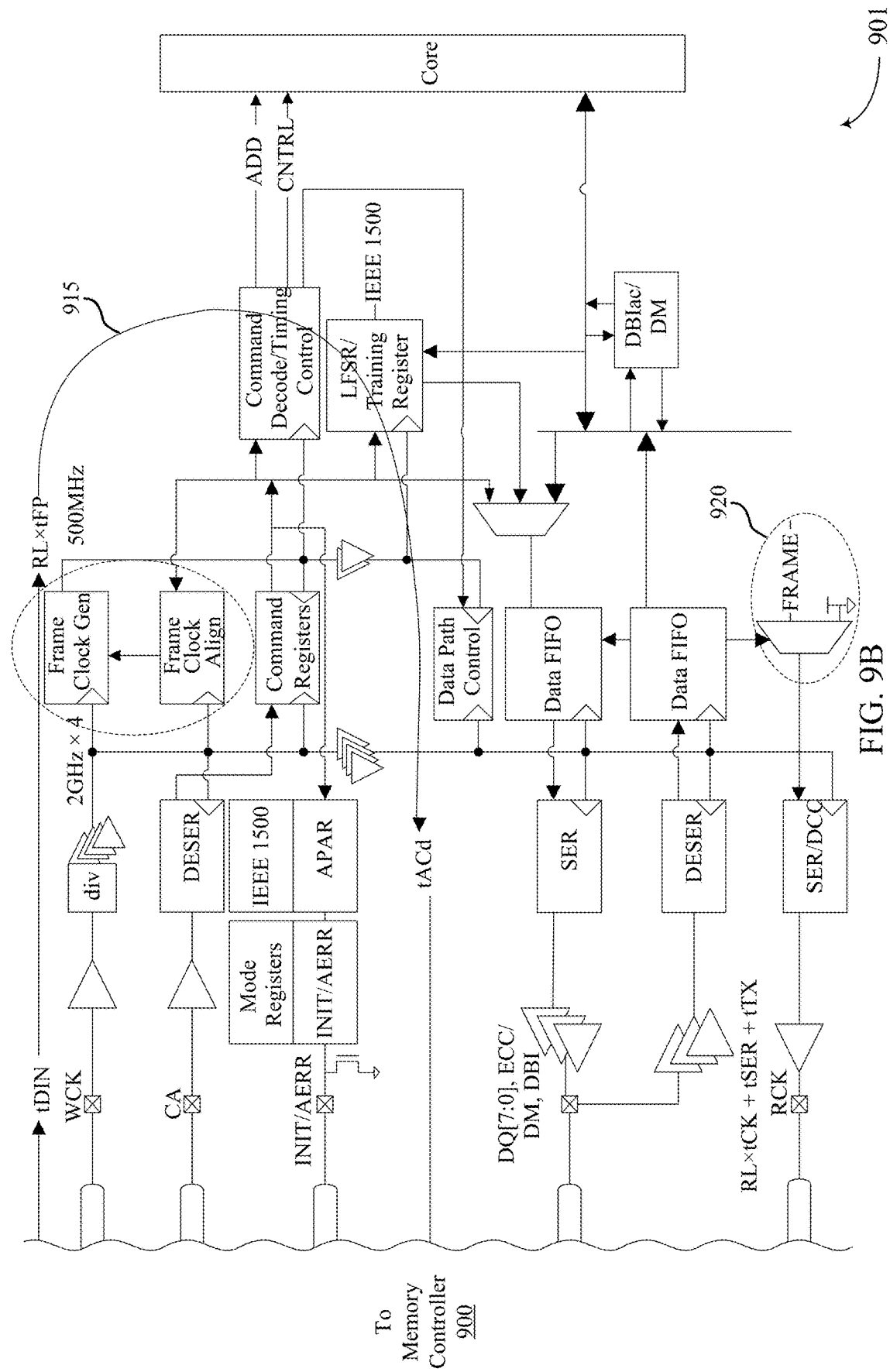

FIG. 9A and FIG. 9B illustrate examples of block diagrams of a memory controller 900 and a memory device 901 that support clock locking for packet based communications of memory devices in accordance with examples as disclosed herein. The memory controller 900 may illustrate a block diagram of one or more memory controllers as described herein, such as a memory controller 805, a memory controller of a host device 105, a memory controller of a memory device 110, a memory controller 500, etc. The memory device 901 may illustrate a block diagram of one or more memory devices described herein, such as a memory device 110 (e.g., DRAM), a memory die 200, a memory device 810, a memory device 501, etc. Although the various devices and components of FIGS. 9A and 9B are illustrated on separate sheets for illustrative clarity, any device or component may be combined, arranged in different locations, include different connections between each other, may include additional components or circuitry (not shown), or may not include some of the shown components or circuitry. Generally, FIGS. 8-11 may illustrate a second example of the techniques and devices described herein. For example, FIG. 9A may illustrate a memory controller 900 with a delay component (e.g., a delay component 845) rather than a clock component (e.g., a clock component 435-*b*) as discussed in FIGS. 4-7.

The delay component may be indicated by the circled area 910 of FIG. 9A. The delay component may include a delay-locked loop circuit. As illustrated, an RCK signal may be routed through a clock tree to one or more DQ inputs of the memory controller 900. The RCK signal may also be routed to a phase detector circuit (e.g., denoted as Phi in FIG. 9A). The phase detector circuit may also receive the reference frame clock, for example, after the reference frame clock is passed through a delay line (e.g., the delay path 915 and other various latencies as described herein) in series with a delay model of the RCK clock tree distribution. The delay model of the RCK clock tree distribution may accurately account for latency with communications, which may enable more efficient and accurate communications in the memory system. For example, the RCK clock tree delay may be represented by tCDNh in the memory controller 900. In some cases, the output of the delay path 915 may also be a timing reference for the output of one or more data FIFO blocks in the memory controller 900.

The delay component may include a delay lock (DL) block. The DL block may align incoming data (e.g., frames indicating the data) to the de-serializer block (e.g., labeled DESER) and a data FIFO block, for example, after the phase alignment of the delayed version of the reference frame clock with the RCK signal at the phase detector circuit. A measurable phase alignment between the reference frame clock of the memory controller 900 and a data frame clock of the memory device 901 may be provided by an I/O circuit path delay of read data latency (e.g., denoted as tDL with reference to at least FIG. 12). In some examples, the memory controller 900 may be configured to track latency differences between two clocks separated in phase by a delay (e.g., a data FIFO block may send reference signals with pointer counts separated by the delay tDL).

In some examples, the reference frame clock may operate in accordance with a first scheme (e.g., 16 UI periods) and one or more components of the memory controller 900 may be configured to drive a replica of the memory device 901 data frame clock on the RCK signal, for example, during idle times between read data transmissions, such that the RCK may operate in accordance with the first scheme during the idle times. The idle times may include channel initialization periods, write data periods, idle DQ bus times, power saving modes of operations, among other examples. In some cases, the memory controller 900 may enable the phase detector during the idle times when the RCK signal is driven from the memory device 901 in accordance with the first scheme (e.g., 16 UI frame periods). For example, the memory controller 900 may enable the phase detector to receive the RCK signal during idle times and disable the phase detector (e.g., configure the phase detector to hold the previously set value) during other times, such as read periods. Such control signaling to enable and/or disable the phase detector may be represented by the input signal labeled update. In some examples, a data FIFO block associated with the controller input may absorb phase drift due to voltage and/or temperature drift, which may enable discontinuous phase detection while maintaining accurate and efficient memory operations.

In some examples, the memory device 901 may include a multiplexing circuit (e.g., a multiplexing component 840 as described with reference to FIG. 8). The multiplexing circuit may be illustrated as one or more components within the circled area 920 of the memory device 901. The multiplexing circuit may be located in the RCK output path from the memory device 901. The multiplexing circuit may be configured to switch the data pattern driven from the RCK between a full-rate clock pattern (e.g., 010101010 . . . ) and a frame clock pattern (e.g., 1111111100000001111 . . . ). An example of the output of the RCK with both a full-rate clock pattern and a frame clock pattern is shown and described with reference to FIGS. 10 and 11. In some examples, the clock pattern may be output on the RCK signal from the DRAM (e.g., the full-rate clock pattern), such as during a transmission of read data via one or more frames from the memory device 901 to the memory controller 900. In some other examples, the frame clock pattern may be output on the RCK signal, such as during idle times (i.e., idle periods). Such a multiplexing circuit may enable increase power savings due to the power associated with toggling the clock being reduced during idle times. Additionally, the multiplexing circuit may enable the memory controller 900 to lock a frame clock of the memory controller 900 to a frame clock of the memory device 901 and track any changes to the timing components (e.g., associated with tDL) so that the read data latency may be accurately tracked.

Figure 10:
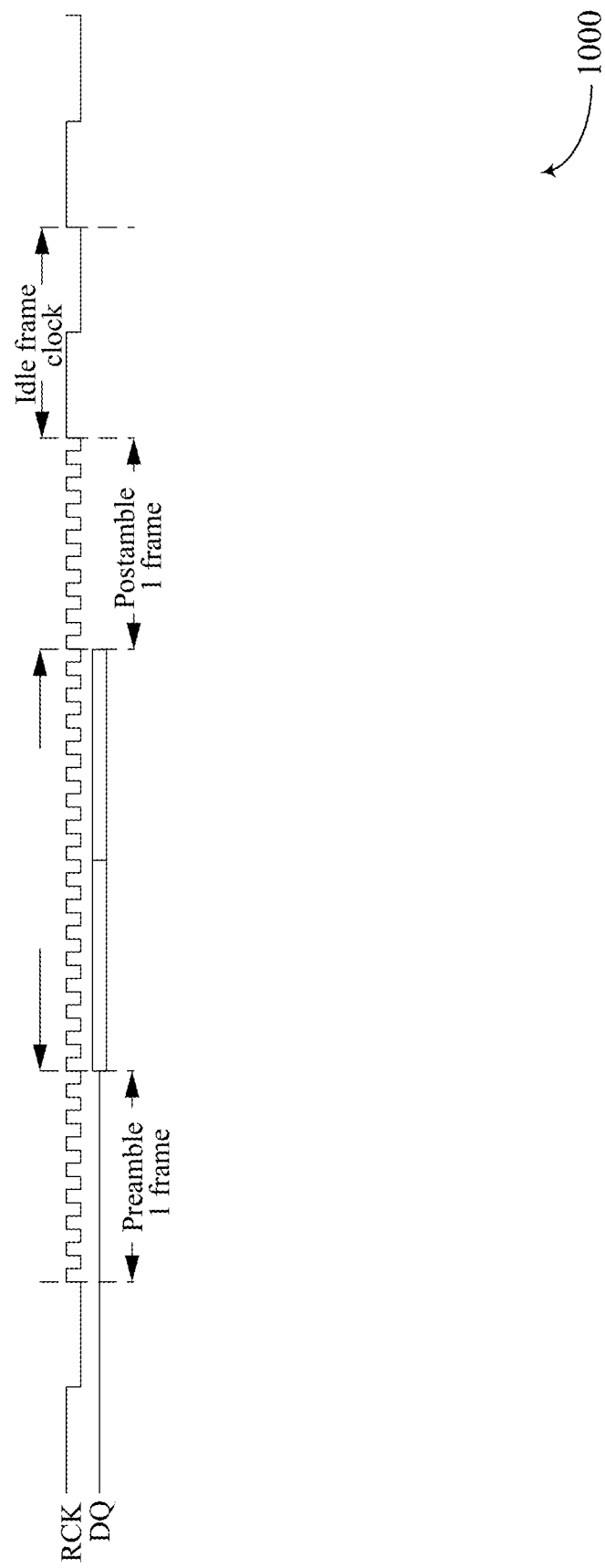
FIG. 10 shows an example of a timing diagram that supports clock locking for frame-based communications of memory devices in accordance with examples as disclosed herein.

FIG. 10 illustrates an example of a timing diagram 1000 that supports clock locking for packet based communications of memory devices in accordance with examples as disclosed herein. Generally, the timing diagram 1000 may illustrate operations associated with switching, by a multiplexing circuit of a memory device such as memory device 901, between a first clock pattern and a second clock pattern (e.g., a full-rate clock pattern and a frame clock pattern as described herein).

In some examples, data may be driven from the memory device and an internal signal may be generated. The internal signal may enable output DQ lanes of the memory device to align to the correct phase of the internal clock (e.g., internal to the memory device). Clock phase data may be launched and based on the discrete read latency (e.g., represented as RL*tFP in FIGS. 9A and 9B) or the total read latency (e.g., RL*tFP+tDL). The frame clock of the memory device may align a signal (e.g., a signal with a pulse width representing two frames of data for an access) to the correct phase of the full-rate clock based on the programmed RL (e.g., the full rate clock may be a divided and/or multi-phase version of the full-rate clock, for example, 4-ph and half rate).

An enable signal associated with the RCK may be generated to allow a one frame RCK preamble to occur (e.g., the enable signal may be generated before data is driven on the DQ bus). In some cases, a multiplexing select signal for RCK data may switch to the full-rate clock pattern (e.g., toggle pattern of 10101010 . . . ) concurrent with the generation of enable signal. The preamble may be configured to excite an RCK lane to reduce inter-symbol interference (ISI) on the first edges of the RCK signal, which may improve data capture timing at the memory controller. In some cases, a DQ bus preamble may also be driven at the same time. In some other cases, the DQ bus preamble may not be driven (e.g., if write data or read data was driven on the DQ bus within a defined period before the expected read data).

In some examples, the RCK signal may follow access rules for post amble and/or preamble periods between the memory controller and the memory device to provide for accurate tracking. For example, the RCK signal may toggle for two frames of read data and then the RCK output enable signal may remain on and toggle for one frame of a post amble period. The RCK output enable signal (i.e., the RCK enable signal) may return to driving the idle frame clock pattern (e.g., aligned with the frame clock of the memory device) after toggling for the one frame of the post amble period.

Figure 11:
FIG. 11 shows an example of a timing diagram that supports clock locking for frame-based communications of memory devices in accordance with examples as disclosed herein.

FIG. 11 illustrates a timing diagram 1100 that supports clock locking for packet based communications of memory devices in accordance with examples as disclosed herein. Specifically, the timing diagram 1100 illustrates scenarios where various spacing of commands (e.g., read commands) may cause overlap and interaction of RCK pattern switching. The timing diagram 1100 shows the various signals on a memory device (e.g., a signal of the multiplexing circuit and the RCK enable signal) spaced according to a discrete latency and a relative command spacing, as described herein. That is, the various signals, spacings, timings, clocks, preambles, and post ambles that support the techniques described herein may be illustrated by the timing diagram 1100 as non-limiting examples.

Figure 12:
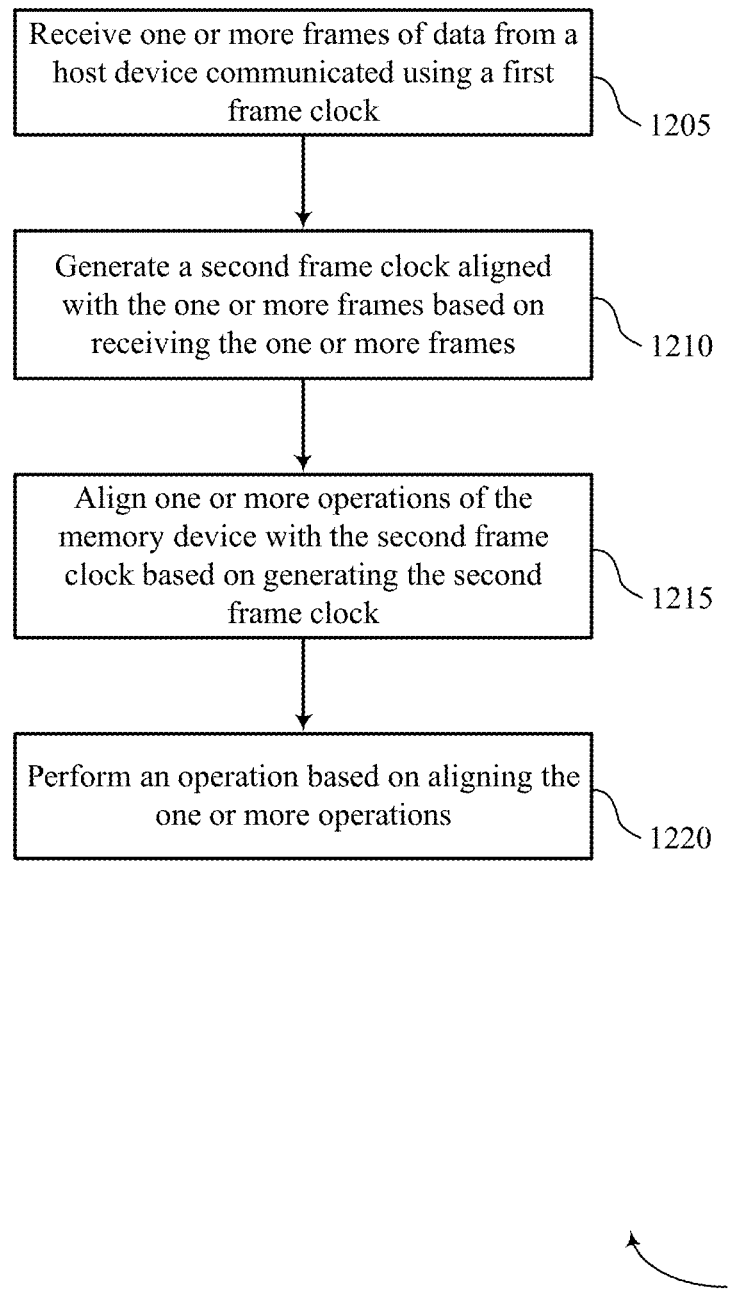
FIGS. 12 and 13 show flowcharts illustrating a method or methods that support clock locking for frame-based communications of memory devices in accordance with examples as disclosed herein.

FIG. 12 shows a flowchart illustrating a method or methods 1200 that supports clock locking for frame-based communications of memory devices in accordance with examples as disclosed herein. The operations of method 1200 may be implemented by a memory device or its components as described herein. For example, the operations of method 1200 may be performed by a memory device as described with reference to FIGS. 1-11. In some examples, a memory device may execute a set of instructions to control the functional elements of the memory device to perform the described functions. Additionally or alternatively, a memory device may perform aspects of the described functions using special-purpose hardware.

At 1205, the memory device may receive one or more frames of data from a host device communicated using a first frame clock. The operations of 1205 may be performed according to the methods and/or devices as described herein.

At 1210, the memory device may generate a second frame clock aligned with the one or more frames based on receiving the one or more frames. The operations of 1210 may be performed according to the methods and/or devices as described herein.

At 1215, the memory device may align one or more operations of the memory device with the second frame clock based on generating the second frame clock. The operations of 1215 may be performed according to the methods and/or devices as described herein.

At 1220, the memory device may perform an operation based on aligning the one or more operations. The operations of 1220 may be performed according to the methods and/or devices as described herein.

In some examples, an apparatus as described herein may perform a method or methods, such as the method 1200. The apparatus may include features, means, or instructions (e.g., a non-transitory computer-readable medium storing instructions executable by a processor) for receiving one or more frames of data from a host device communicated using a first frame clock, generating a second frame clock aligned with the one or more frames based on receiving the one or more frames, aligning one or more operations of the memory device with the second frame clock based on generating the second frame clock, and performing an operation based on aligning the one or more operations.

Some examples of the method 1200 and the apparatus described herein may further include operations, features, means, or instructions for performing one or more read operations, one or more write operations, or a combination thereof based on the one or more commands. Some examples of the method 1200 and the apparatus described herein may further include operations, features, means, or instructions for aligning the second frame clock with the one or more frames of data, where aligning the one or more operations of the memory device with the second frame clock may be based on aligning the second frame clock with the one or more frames of data. Some examples of the method 1200 and the apparatus described herein may further include operations, features, means, or instructions for transmitting, to the host device, a data signal aligned with the second frame clock, and transmitting, to the host device, a return clock signal to indicate unit intervals associated with the data signal.

Some examples of the method 1200 and the apparatus described herein may further include operations, features, means, or instructions for toggling the return clock signal from the first symbol pattern to the second symbol pattern based on transmitting the data signal. In some examples of the method 1200 and the apparatus described herein, the first symbol pattern of the return clock signal indicates a start of a frame indicated by the second frame clock and the second symbol pattern of the return clock signal indicates the unit intervals associated with the data signal.

Some examples of the method 1200 and the apparatus described herein may further include operations, features, means, or instructions for receiving, from the host device, a clock signal that indicates unit intervals of data transmitted from the host device, where generating the second frame clock may be based on receiving the clock signal. In some examples of the method 1200 and the apparatus described herein, each frame of the one or more frames of data includes an integer quantity of unit intervals corresponding to a clock. In some examples of the method 1200 and the apparatus described herein, the one or more frames of data received from the host device may be communicated as part of a training procedure.

Figure 13:
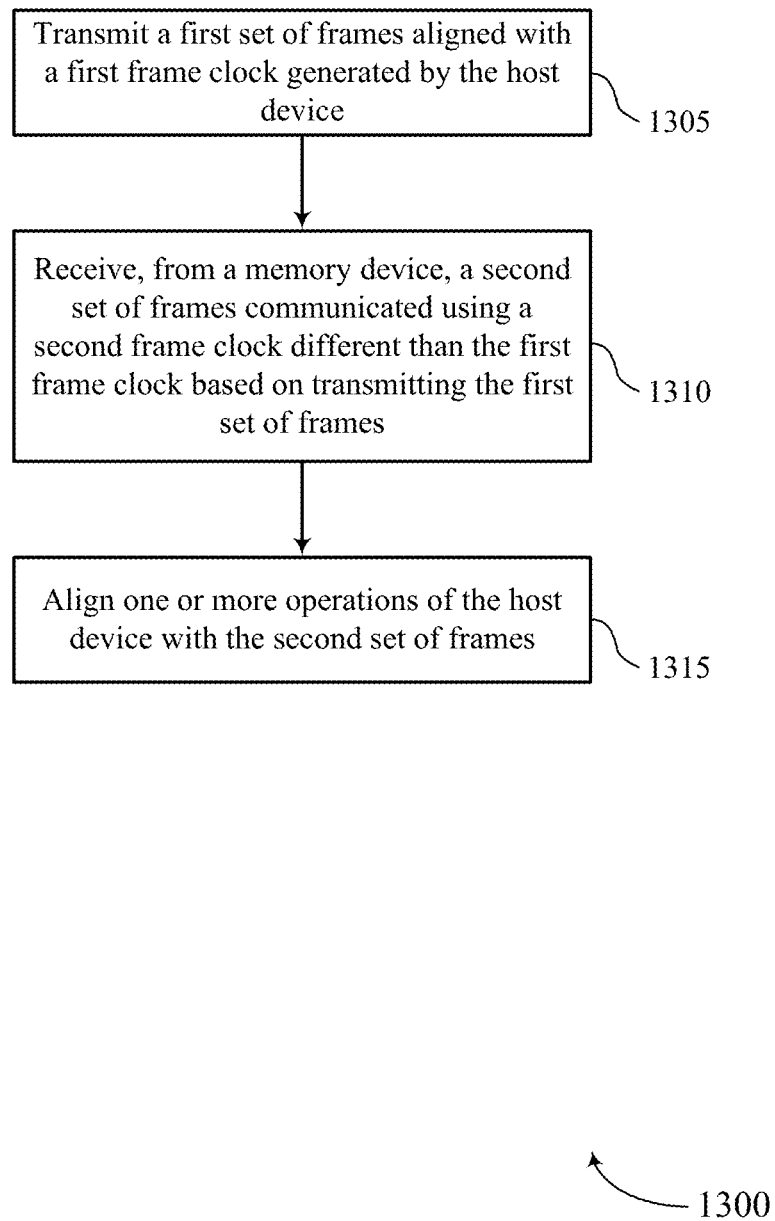

FIG. 13 shows a flowchart illustrating a method or methods 1300 that supports clock locking for frame-based communications of memory devices in accordance with examples as disclosed herein. The operations of method 1300 may be implemented by a memory controller and/or a memory device as described herein. For example, the operations of method 1300 may be performed by a host device, such as a memory controller of the host device as described with reference to FIGS. 1-11. In some examples, a host device may execute a set of instructions to control the functional elements of the host device to perform the described functions. Additionally or alternatively, a host device may perform aspects of the described functions using special-purpose hardware.

At 1305, the host device may transmit a first set of frames aligned with a first frame clock generated by the host device. The operations of 1305 may be performed according to the methods and/or devices as described herein.

At 1310, the host device may receive, from a memory device, a second set of frames communicated using a second frame clock different than the first frame clock based on transmitting the first set of frames. The operations of 1310 may be performed according to the methods and/or devices as described herein.

At 1315, the host device may align one or more operations of the host device with the second set of frames. The operations of 1315 may be performed according to the methods and/or devices as described herein.

In some examples, an apparatus as described herein may perform a method or methods, such as the method 1300. The apparatus may include features, means, or instructions (e.g., a non-transitory computer-readable medium storing instructions executable by a processor) for transmitting a first set of frames aligned with a first frame clock generated by the host device, receiving, from a memory device, a second set of frames communicated using a second frame clock different than the first frame clock based on transmitting the first set of frames, and aligning one or more operations of the host device with the second set of frames.

Some examples of the method 1300 and the apparatus described herein may further include operations, features, means, or instructions for generating a third frame clock aligned with the second set of frames based on receiving the second set of frames from the memory device, where aligning the one or more operations may be based on generating the third frame clock. In some examples of the method 1300 and the apparatus described herein, aligning the one or more operations of the host device with the second set of frames may include operations, features, means, or instructions for aligning the second set of frames with the first frame clock based on a latency difference between the first frame clock and the second frame clock. Some examples of the method 1300 and the apparatus described herein may further include operations, features, means, or instructions for transmitting, with the first set of frames, a clock signal indicating unit intervals of data corresponding to the first set of frames.

Some examples of the method 1300 and the apparatus described herein may further include operations, features, means, or instructions for receiving, from the memory device, a data signal aligned with the second frame clock, and receiving, from the memory device, a return clock signal indicating unit intervals associated with the data signal. In some examples of the method 1300 and the apparatus described herein, the return clock signal includes a first symbol pattern during a first time period and a second symbol pattern during a second time period, and where the first symbol pattern indicates a start of a frame indicated by the second frame clock and the second symbol pattern indicates the unit intervals associated with the data signal.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a data channel operable to receive one or more frames of data from a host device communicated using a first frame clock, and a first component operable to generate a second frame clock aligned with the one or more frames based on receiving the one or more frames, the second frame clock operable to align one or more operations of the apparatus with the one or more frames of data received from the host device based on the second frame clock.

Some examples of the apparatus may include a second component operable to perform a read operation based at least in part on receiving the one or more frames, and transmit, to the host device, a data signal aligned with the second frame clock. In some examples, the second component may further be operable to transmit, to the host device, a return clock signal to indicate unit intervals associated with the data signal, the return clock signal associated with the second frame clock.

Some examples of the apparatus may include a second component operable to transmit, during a first time period, a return clock signal with a first symbol pattern, and transmit, during a second time period, the return clock signal with a second symbol pattern. In some examples, the first symbol pattern of the return clock signal indicates a start of a frame indicated by the second frame clock, and the second symbol pattern of the return clock signal indicates unit intervals associated with a data signal.

In some examples, the first component may further be operable to receive, from the host device, a clock signal that indicates unit intervals of data transmitted from the host device, where generating the second frame clock may be based on receiving the clock signal. In some examples, each frame includes an integer quantity of unit intervals corresponding to a clock. In some examples, the one or more frames received from the host device may be communicated as part of a training procedure. In some examples, the first component includes a frame clock generation circuit.

An apparatus is described. The apparatus may include a processor, memory in electronic communication with the processor, and instructions stored in the memory and executable by the processor to cause the apparatus to receive one or more frames of data from a host device communicated using a first frame clock, generate a second frame clock aligned with the one or more frames based on receiving the one or more frames of data, align one or more operations of the apparatus with the second frame clock based on generating the second frame clock, and perform an operation based on aligning the one or more operations.

In some examples, the one or more frames of data indicate one or more commands, and the memory further includes instructions to cause the apparatus to perform one or more read operations, one or more write operations, or a combination thereof based on the one or more commands. In some examples, the memory further may include operations, features, means, or instructions for aligning the second frame clock with the one or more frames of data, where aligning the one or more operations of the apparatus with the second frame clock may be based on aligning the second frame clock with the one or more frames of data. In some examples, the memory further may include operations, features, means, or instructions for transmit, to the host device, a data signal aligned with the second frame clock, and transmit, to the host device, a return clock signal to indicate unit intervals associated with the data signal.

In some examples, the return clock signal corresponds to a first symbol pattern during a first time period and a second symbol pattern during a second time period, and the memory further includes instructions to cause the apparatus to toggle the return clock signal from the first symbol pattern to the second symbol pattern based on transmitting the data signal. In some examples, the first symbol pattern of the return clock signal indicates a start of a frame indicated by the second frame clock and the second symbol pattern of the return clock signal indicates the unit intervals associated with the data signal.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus comprising:
   an array of memory cells;
   a data channel operable to receive one or more frames of data from a host device communicated using a first frame clock, wherein the one or more frames of data comprise one or more training frames; and
   a first component operable to generate a second frame clock aligned with the one or more frames based at least in part on receiving the one or more training frames, the second frame clock operable to align one or more operations of the apparatus with the one or more frames of data received from the host device based at least in part on the second frame clock.

2. The apparatus of claim 1, further comprising:
   a second component operable to:
      perform a read operation based at least in part on receiving the one or more frames; and
      transmit, to the host device, a data signal aligned with the second frame clock.

3. The apparatus of claim 2, wherein the second component is further operable to:
   transmit, to the host device, a return clock signal to indicate unit intervals associated with the data signal, the return clock signal associated with the second frame clock.

4. The apparatus of claim 1, further comprising:
   a second component operable to:
      transmit, during a first time period, a return clock signal with a first symbol pattern; and
      transmit, during a second time period, the return clock signal with a second symbol pattern.

5. The apparatus of claim 4, wherein:
   the first symbol pattern of the return clock signal indicates a start of a frame indicated by the second frame clock; and
   the second symbol pattern of the return clock signal indicates unit intervals associated with a data signal.

6. The apparatus of claim 1, wherein the first component is further operable to:
   receive, from the host device, a clock signal that indicates unit intervals of data transmitted from the host device, wherein generating the second frame clock is based at least in part on receiving the clock signal.

7. The apparatus of claim 1, wherein each frame comprises an integer quantity of unit intervals corresponding to a clock.

8. The apparatus of claim 1, wherein the one or more frames received from the host device is communicated as part of a training procedure.

9. The apparatus of claim 1, wherein the first component comprises a frame clock generation circuit.

10. A system comprising:
    a host device operable to:
       generate a first frame clock;
       transmit one or more frames of data based at least in part on the first frame clock, wherein the one or more frames of data comprise one or more training frames; and
    a memory device comprising a plurality of memory cells and operable to:
       receive the one or more frames of data; and
       align a second frame clock generated at the memory device to the one or more training frames.

11. The system of claim 10, wherein transmitting the one or more frames of data further comprises:
    transmitting a first clock signal with the one or more frames of data, the first clock signal indicating unit intervals associated with the one or more frames of data transmitted by the host device.

12. The system of claim 10, wherein the memory device is operable to:
    receive, during a first frame of the second frame clock, a read command to cause the memory device to perform a read operation; and
    transmit, during a second frame of the second frame clock, read data to the host device based at least in part on receiving the read command.

13. A system comprising:
    a host device operable to:
       generate a first frame clock;
       transmit one or more frames of data based at least in part on the first frame clock; and
    a memory device comprising a plurality of memory cells and operable to:
       receive the one or more frames of data;
       align a second frame clock generated at the memory device to the one or more frames of data;
       transmit, during a first time period, a return clock signal with a first symbol pattern, wherein the first symbol pattern of the return clock signal indicates a start of a frame indicated by the second frame clock; and
       transmit, during a second time period, the return clock signal with a second symbol pattern, wherein the second symbol pattern of the return clock signal indicates unit intervals associated with a data signal.

14. The system of claim 13, wherein the host device is operable to:
    receive, during the second time period, read data from the memory device based at least in part on transmitting the one or more frames of data; and
    align the read data with the return clock signal based at least in part on a delay locked loop circuit, a frame clock generation circuit, or both.

15. A method at a memory device, comprising:
    receiving one or more frames of data from a host device communicated using a first frame clock, wherein the one or more frames of data comprise one or more training frames;
    generating a second frame clock aligned with the one or more frames based at least in part on receiving the one or more training frames;
    aligning one or more operations of the memory device with the second frame clock based at least in part on generating the second frame clock; and
    performing an operation based at least in part on aligning the one or more operations.

16. The method of claim 15, wherein the one or more frames of data indicate one or more commands, further comprising:
    performing one or more read operations, one or more write operations, or a combination thereof based at least in part on the one or more commands.

17. The method of claim 15, further comprising:
    aligning the second frame clock with the one or more frames of data, wherein aligning the one or more operations of the memory device with the second frame clock is based at least in part on aligning the second frame clock with the one or more frames of data.

18. The method of claim 15, further comprising:
transmitting, to the host device, a data signal aligned with the second frame clock; and
transmitting, to the host device, a return clock signal to indicate unit intervals associated with the data signal.

19. The method of claim 18, wherein the return clock signal corresponds to a first symbol pattern during a first time period and a second symbol pattern during a second time period, further comprising:
toggling the return clock signal from the first symbol pattern to the second symbol pattern based at least in part on transmitting the data signal.

20. The method of claim 19, wherein the first symbol pattern of the return clock signal indicates a start of a frame indicated by the second frame clock and the second symbol pattern of the return clock signal indicates the unit intervals associated with the data signal.

21. The method of claim 15, further comprising:
receiving, from the host device, a clock signal that indicates unit intervals of data transmitted from the host device, wherein generating the second frame clock is based at least in part on receiving the clock signal.

22. The method of claim 15, wherein each frame of the one or more frames of data comprises an integer quantity of unit intervals corresponding to a clock.

23. The method of claim 15, wherein the one or more frames of data received from the host device is communicated as part of a training procedure.

24. A method at a host device, comprising:
transmitting a set of training frames aligned with a first frame clock generated by the host device;
receiving, from a memory device, a second set of frames communicated using a second frame clock different than the first frame clock based at least in part on transmitting the set of training frames; and
aligning one or more operations of the host device with the second set of frames.

25. A method at a host device, comprising:
transmitting a first set of frames aliened with a first frame clock generated by the host device;
receiving, from a memory device, a second set of frames communicated using a second frame clock different than the first frame clock based at least in part on transmitting the first set of frames;
aligning one or more operations of the host device with the second set of frames; and
generating a third frame clock aligned with the second set of frames based at least in part on receiving the second set of frames from the memory device, wherein aligning the one or more operations is based at least in part on generating the third frame clock.

26. A method at a host device, comprising:
transmitting a first set of frames aliened with a first frame clock generated by the host device;
receiving, from a memory device, a second set of frames communicated using a second frame clock different than the first frame clock based at least in part on transmitting the first set of frames; and
aligning one or more operations of the host device with the second set of frames based at least in part on a latency difference between the first frame clock and the second frame clock.

27. The method of claim 24, further comprising:
transmitting, with the set of training frames, a clock signal indicating unit intervals of data corresponding to the set of training frames.

28. The method of claim 24, further comprising:
receiving, from the memory device, a data signal aligned with the second frame clock; and
receiving, from the memory device, a return clock signal indicating unit intervals associated with the data signal.

29. The method of claim 28, wherein the return clock signal comprises a first symbol pattern during a first time period and a second symbol pattern during a second time period, and wherein the first symbol pattern indicates a start of a frame indicated by the second frame clock and the second symbol pattern indicates the unit intervals associated with the data signal.

30. An apparatus, comprising:
a processor,
memory in electronic communication with the processor, and
instructions stored in the memory and executable by the processor to cause the apparatus to:
receive one or more frames of data from a host device communicated using a first frame clock, wherein the one or more frames of data comprise one or more training frames;
generate a second frame clock aligned with the one or more frames based at least in part on receiving the one or more training frames;
align one or more operations of the apparatus with the second frame clock based at least in part on generating the second frame clock; and
perform an operation based at least in part on aligning the one or more operations.

31. The apparatus of claim 30, wherein the one or more frames of data indicate one or more commands, the memory further comprising instructions to cause the apparatus to:
perform one or more read operations, one or more write operations, or a combination thereof based at least in part on the one or more commands.

32. The apparatus of claim 30, wherein the memory further comprises instructions executable by the processor to cause the apparatus to:
align the second frame clock with the one or more frames of data, wherein aligning the one or more operations of the apparatus with the second frame clock is based at least in part on aligning the second frame clock with the one or more frames of data.

33. The apparatus of claim 30, wherein the memory further comprises instructions executable by the processor to cause the apparatus to:
transmit, to the host device, a data signal aligned with the second frame clock; and
transmit, to the host device, a return clock signal to indicate unit intervals associated with the data signal.

34. The apparatus of claim 33, wherein the return clock signal corresponds to a first symbol pattern during a first time period and a second symbol pattern during a second time period, the memory further comprising instructions to cause the apparatus to:
toggle the return clock signal from the first symbol pattern to the second symbol pattern based at least in part on transmitting the data signal.

35. The apparatus of claim 34, wherein the first symbol pattern of the return clock signal indicates a start of a frame indicated by the second frame clock and the second symbol pattern of the return clock signal indicates the unit intervals associated with the data signal.

* * * * *